United States Patent [19]
Day et al.

[11] Patent Number: 5,663,966
[45] Date of Patent: Sep. 2, 1997

[54] SYSTEM AND METHOD FOR MINIMIZING SIMULTANEOUS SWITCHING DURING SCAN-BASED TESTING

[75] Inventors: Leland Leslie Day; Steven Michael Douskey; Paul Allen Ganfield, all of Rochester, Minn.

[73] Assignee: International Business Machines Corporation, Armonk, N.Y.

[21] Appl. No.: 686,105

[22] Filed: Jul. 24, 1996

[51] Int. Cl.$^6$ ............................................ H04B 17/00
[52] U.S. Cl. ................................................ 371/22.36
[58] Field of Search ............................. 371/22.3, 22.1, 371/22.5, 27; 324/158.1; 395/183.06

[56] References Cited

U.S. PATENT DOCUMENTS

| | | |
|---|---|---|
| 4,644,265 | 2/1987 | Davidson et al. |
| 4,817,093 | 3/1989 | Jacobs et al. |
| 4,918,379 | 4/1990 | Jongepier. |
| 5,077,740 | 12/1991 | Kanuma. |
| 5,321,277 | 6/1994 | Sparks et al. |
| 5,606,565 | 2/1997 | Edler et al. ............ 371/223 |

*Primary Examiner*—Vincent P. Canney
*Attorney, Agent, or Firm*—Merchant & Gould

[57] ABSTRACT

A system and method for reducing simultaneous switching during scan-based testing of a system logic design. System logic is divided into clusters of system logic, and one or more scan chains are associated with each logic cluster. Each of the logic clusters are concurrently scan tested, yet circuitry in the scan chains associated with a cluster are triggered at different times than the circuitry in the scan chains of other clusters. Offset scan control signals provide the triggering for the scan chains of different clusters. Release and capture functions are also controlled to reduce simultaneous release and capture switching in different clusters.

41 Claims, 18 Drawing Sheets

SYSTEM AND METHOD FOR MINIMIZING SIMULTANEOUS SWITCHING DURING SCAN-BASED TESTING

FIELD OF THE INVENTION

The present invention relates generally to scan-based testing of system design logic. More particularly, the present invention relates to a system and method for reducing simultaneous switching during concurrent scan testing, by testing selected clusters of the system design logic and offsetting control signals associated with clusters.

BACKGROUND OF THE INVENTION

The testing of large scale integration (LSI) packages, very large scale integration (VLSI) packages and application-specific integrated circuits (ASIC) has become increasingly important as these components and circuits continue to increase in gate densities. With every successive generation having a greater number of gates to test, simultaneous switching concerns in systems utilizing scan-based testing become more prevalent. Where every latching device in a scan chain is clocked at the same time, electrical noise caused by the simultaneous scan shifting can cause corrupted test results. Therefore, it is desirable to reduce simultaneous switch concerns in scan-based testing techniques.

Generally, scan design approaches comprise a test operation wherein certain desired logic test patterns are serially inputted and shifted to the appropriate latch locations when the unit is operated in the "shift mode" (i.e., by withholding the system clock excitations and turning on the shift scan control signals to the unit). When this is done, the latch states will provide the desired stimuli for the testing of the related logic nets. Next, the test patterns are propagated through the nets by executing one or more steps of the "function mode" operation (i.e., by exercising one or more system clock excitations). The response patterns of the logic networks to the applied stimuli is captured by the system latches, in a known manner depending on certain details of hardware design, often replacing the original inputted test patterns. Then, the system reverts to the shift-mode operation, outputting the response patterns for examination and comparison with expected patterns which should be present if the circuitry has operated properly. The scan-based test technique is employed to test the component chips of the package as well as the package. The technique logically partitions the dense scan logic into portions which are bounded on the inputs and outputs by Shift Register Latches (SRLs) and package pins wherever system logic dictates. Tests are then generated individually for each partition.

A typical scan design approach can be seen in the scan design circuit 10 of FIG. 1. Logic 12 has multiple inputs 14, and generates outputs to latch 16, and latch 18 through latch 20. Logic 22 receives inputs from latch 16, latch 18, through latch 20, and generates outputs to latch 24, latch 26 through latch 28. Logic 30 receives inputs from latch 24, latch 26 through latch 28, and has multiple outputs 32 to output the data. Each of the latching devices in circuit 10 is typically a D-type flip-flop having a data (D) input for receiving system data from the logic circuits. The scan data (SD) input of latch 16 receives logic test patterns as scan data input signals on line 34, and continually shifts its present Q output to the SD input of the next daisy-chained latch. The shift occurs each time an active pulse of the clock signal on line 36 is received at the clock (CLK) input when the scan enable (SE) input is set by the scan enable signal on line 38 to acknowledge the scan data rather than the system data. Each of the daisy-chained latches shifts its current bit to the next latch until the entire logic test pattern has been shifted in. The D inputs can then receive inputs from the logic circuits when the scan enable (SE) input is set by the scan enable signal on line 38 to acknowledge the system data rather than the scan data. The system data is then stored in parallel in the latches. The latched results of the test are then shifted out at the scan data output on line 40 to be compared to expected test pattern results.

One such scan testing system is disclosed in U.S. Pat. No. 4,817,093 issued on Mar. 28, 1989 to Jacobs et al. Jacobs et al. describes various scan test techniques, and provides a method and structure for partitioning, testing and diagnosing a multi-chip packaging structure by inhibiting all chips in the multi-chip package except for the chip or chips under test. However, Jacobs et al. only scans or tests one chip or group of chips at a time. Furthermore, such a system allows isolation of particular chips to be tested, but does not address electrical noise considerations where the chip or chips under test involves simultaneous switching of such magnitude so as to potentially corrupt the testing process. It is desirable to test all portions of one or more chips under test, while regulating the switching to avoid the adverse effects of large-scale simultaneous switching.

U.S. Pat. No. 4,644,265 issued on Feb. 17, 1987 to Davidson et al. is directed to a test system for reducing off-chip driver switching noise by implementing a sequencing network for sequentially conditioning the off-chip driver circuits for possible switching. Although Davidson et al. addresses reducing a number of driver circuits concurrently switching logic states, the system does not address noise reduction in a scan-based test system with overlapping logic clusters having the ability to perform scan shifting, releasing, and capturing operations at predetermined times. Simultaneous switching of scan-based testing systems can present immense electrical noise problems where scan chains become increasingly large.

One scan-based testing system described in U.S. Pat. No. 5,077,740 issued on Dec. 31, 1991 to Kanuma describes the testing of one or more circuit macrocells. One object of the Kanuma design is to provide a logic circuit which can separate a circuit portion to be tested from other circuit portions and test the circuit portion by using presently-available test data for the circuit portion. Another object is to provide a logic circuit which can carry out one cycle of a test while receiving data to be used for the next cycle of the test. However, such a system tests only One "portion" at a time, and a transfer clock simultaneously transfers all latched test bits in a "portion" to a shift register. Therefore, multiple portions are not concurrently tested through the use of offset clocking techniques for scan shift, release and capture functions. Similarly, U.S. Pat. No. 4,918,379 issued on Apr. 17, 1990 to Jongepier allows the testing of macro circuits, but scans or tests one section at a time.

It is therefore desirable to allow concurrent testing of multiple sections of one or more chips under scan test. The present invention provides a system and method for concurrently providing scan control signals to multiple clusters of logic to be tested, yet provides for offset scan control signalling during scan shift, release, and capture to reduce simultaneous switching. The present invention therefore provides a solution to this and other problems, and offers other advantages over the prior art.

SUMMARY OF THE INVENTION

The present invention relates to a system and method for reducing simultaneous switching during concurrent scan-based testing of selected clusters of the system design logic by offsetting groups of scan and test control signals associated with the selected scan and logic clusters.

In accordance with one embodiment of the invention, a method for reducing simultaneous switching during scan-based testing of system logic is provided. The system logic is divided into a plurality of logic and scan clusters, where each of the scan clusters includes one or more scan chains. Scan control signals are generated for each of the designated scan clusters, and the triggering edges of each of the scan control signals are offset from one another such that each of the scan control signals provides triggering edges at different times. Test control signals are also generated for each of the logic clusters to control release and capture functions in the designated logic clusters to selectively prevent the simultaneous occurrence of the release and capture functions.

In accordance with another embodiment of the invention, a scan test system for use with a pattern generator is provided. The pattern generator generates serial patterns of test bits for testing a system logic design. The system logic includes a plurality of predetermined logic clusters. A signal generator concurrently generates a plurality of phase-shifted scan control signals. Each logic cluster may have a part of, or one or more scan latch chains coupled to it, each of which receives a different phase-shifted scan control signal. The scan latch chains receive one of the serial patterns of test bits from the pattern generator, and the pattern of test bits is stepped through the scan latch chain on each triggering edge of its corresponding phase-shifted scan control signal.

These and other features and advantages of the present invention will become readily apparent to those skilled in the art from the following detailed description and corresponding drawings. As will be realized, the invention is capable of modification without departing from the invention. Accordingly, the drawing and description are to be regarded as illustrative in nature, and not as restrictive.

DETAILED DESCRIPTION OF THE PREFERRED EMBODIMENTS

Figure 1:
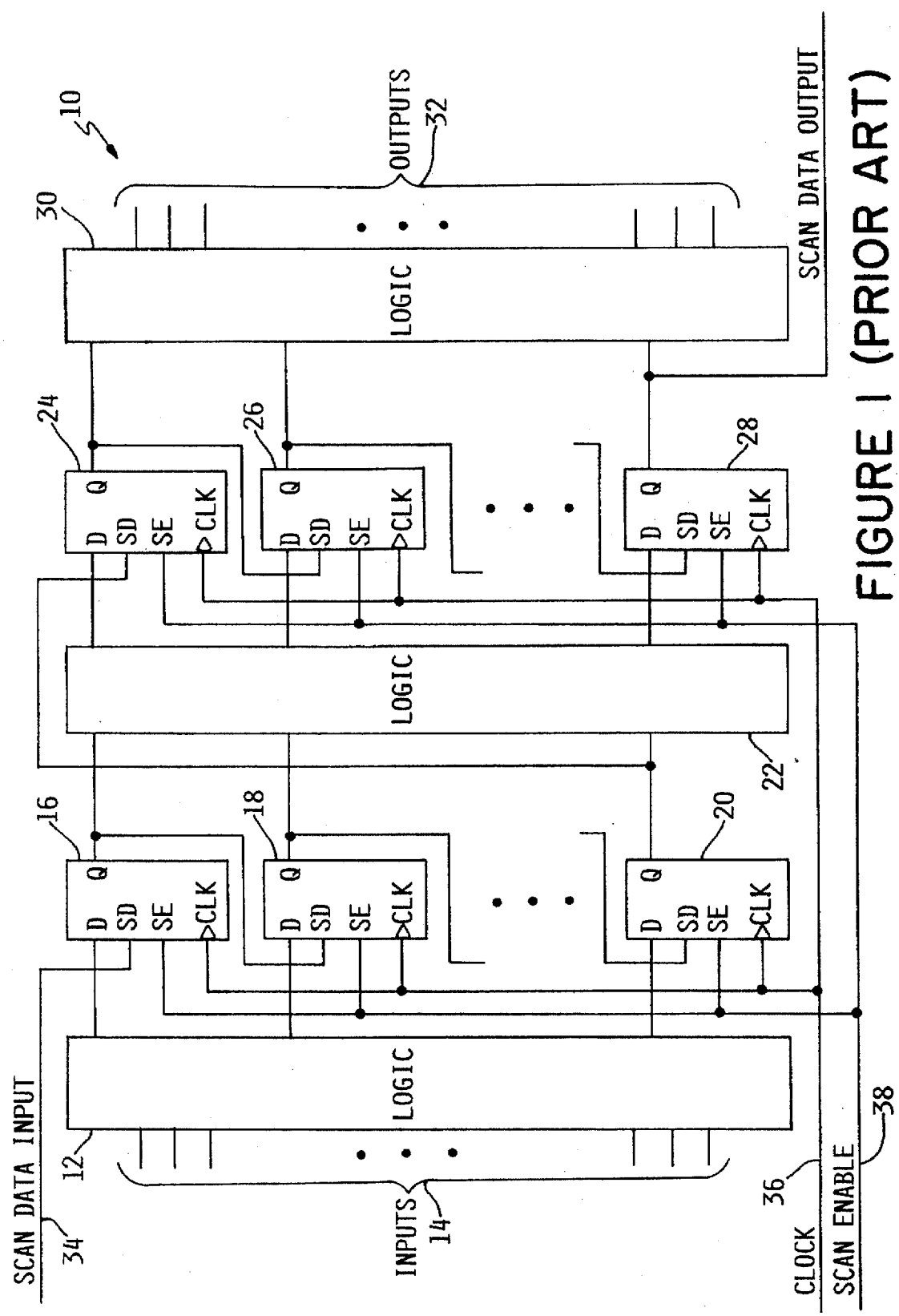
FIG. 1 is a block diagram of a prior art scan test system.
Figure 2:
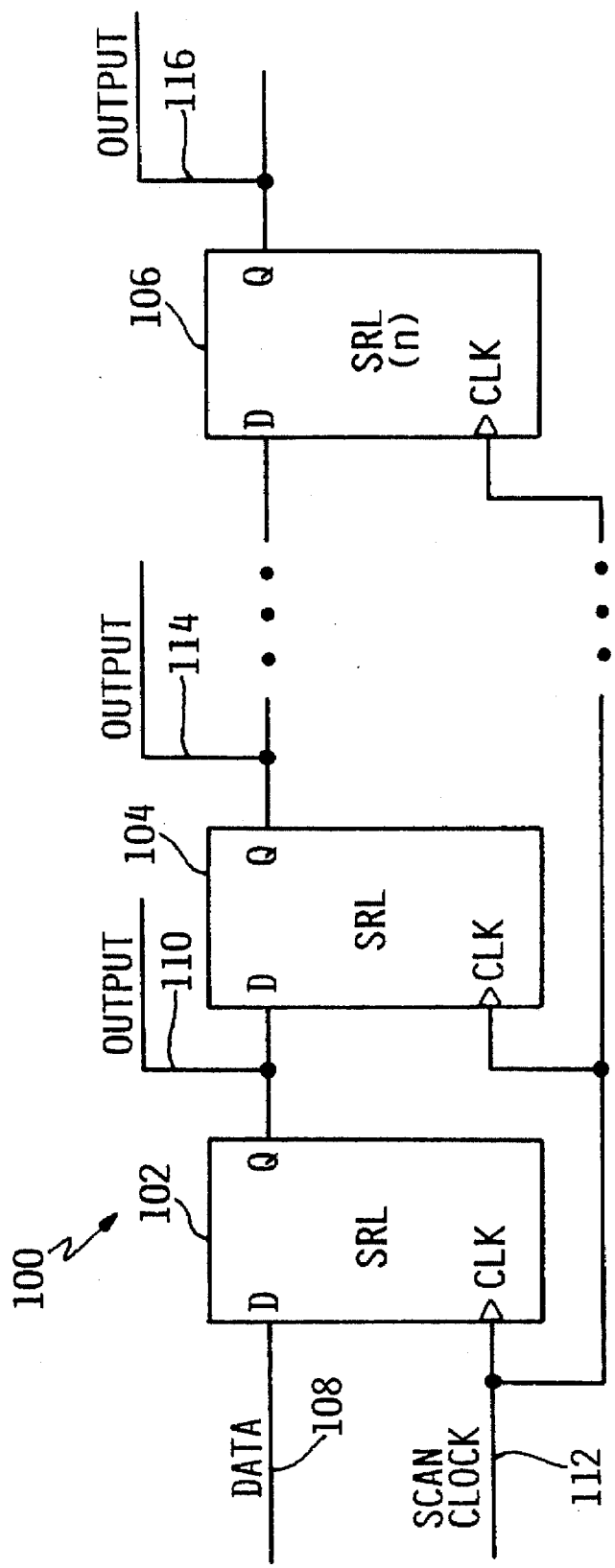
FIG. 2 is a block diagram of a scan chain having multiple latches coupled in series.

FIG. 2 is a diagram of a scan chain 100, having multiple latches coupled in series. Scan chain 100 includes shift register latch (SRL) 102, SRL 104, through SRL(n) 106. A shift register latch (SRL) latches an input data bit at its output upon receiving a clock signal. SRL 102 receives a serial stream of data on line 108 at its D input, and latches a particular data bit on line 108 at its Q output on line 110 upon receiving a scan clock signal on line 112. The scan clock signal is more generically referred to as a scan control or a scan enable signal, since it enables the data on line 108 to be shifted through the scan chain 100. The output on line 110 is also coupled to the D input of SRL 104 to be latched at the Q output on line 114 upon the occurrence of another scan clock signal on line 112. Each bit of data in the serial data stream on line 108 is similarly shifted in to scan chain 100 until the first data bit of the serial stream of data is latched at the output 116 of SRL(n) 106. The serial stream of data inputted on line 108 is thereby made available on output lines 110, 114, through 116 in parallel.

Figure 3:
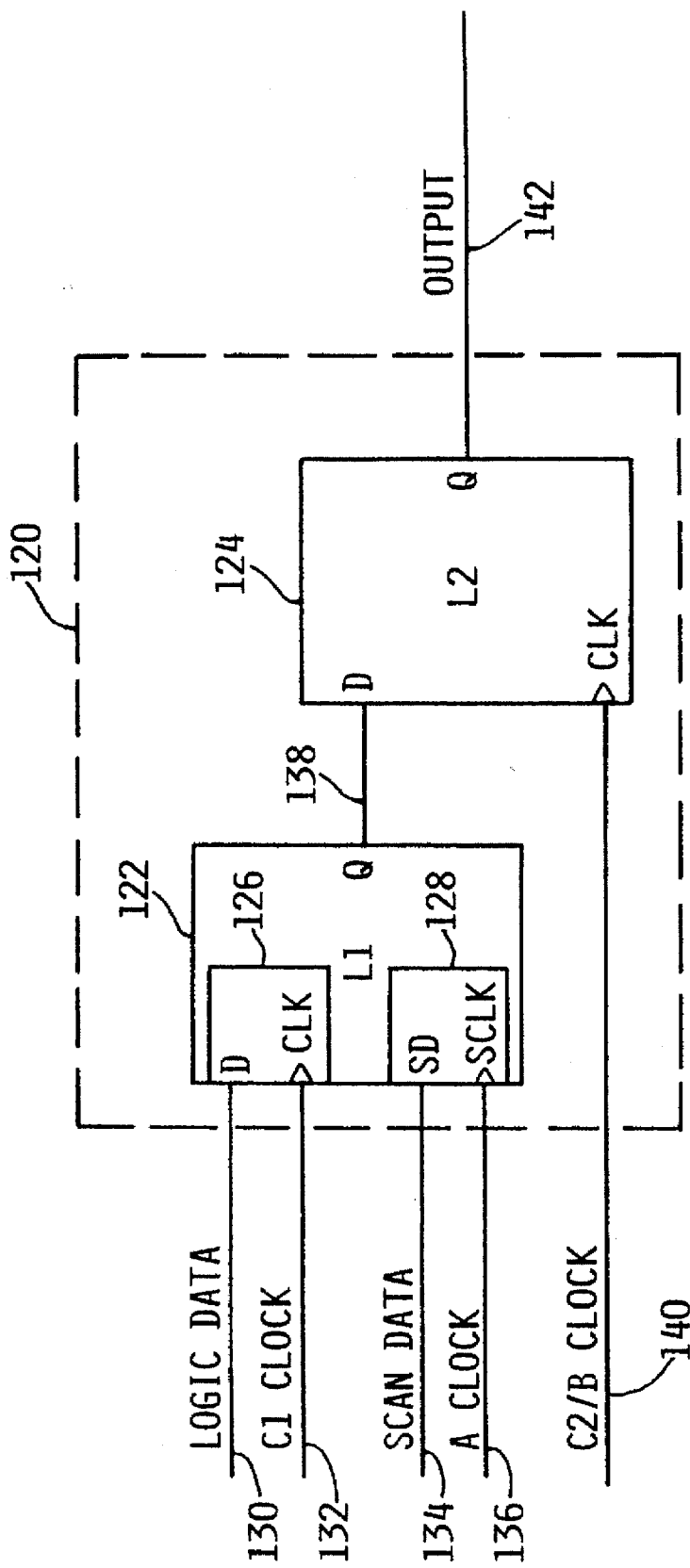
FIG. 3 is a block diagram of a shift register latch (SRL) as implemented in one embodiment of the invention.

Referring now to FIG. 3, a shift register latch (SRL) 120 of one embodiment of the invention is shown. SRL 120, which is representative of any of the SRLs 102, 104, 106, includes latches L1 122 and L2 122. Latch L1 122 includes two input ports, labeled port 126 and port 128. Port 126 includes a D input and a clock (CLK) input. The D input receives logic data on line 130, and the CLK input of port 126 receives the C1 clock signal on line 132. Port 128 includes a scan data input (SD) to receive scan data on line 134, and a scan clock input (SCLK) to receive an A clock signal on line 136. A bit of the scan data signal on line 134 is clocked to the Q output of latch L1 122 on an active edge of the A clock signal on line 136. The Q output of latch L1 122 on line 138 is coupled to the D input of latch L2 124. The output signal on line 138 is clocked to the Q output of latch L2 124 on an active edge of the C2/B clock signal on line 140. Latch L2 124 then has the bit of scan data from line 134 latched at the output of latch L2 124 as the output signal on line 142. As additional bits of scan data on line 134 are presented to SRL 120, they will continually be latched on line 142 as the A clock and C2/B clock on lines 136 and 140 respectively continue to propagate the scan data bits from line 134.

Figure 4:
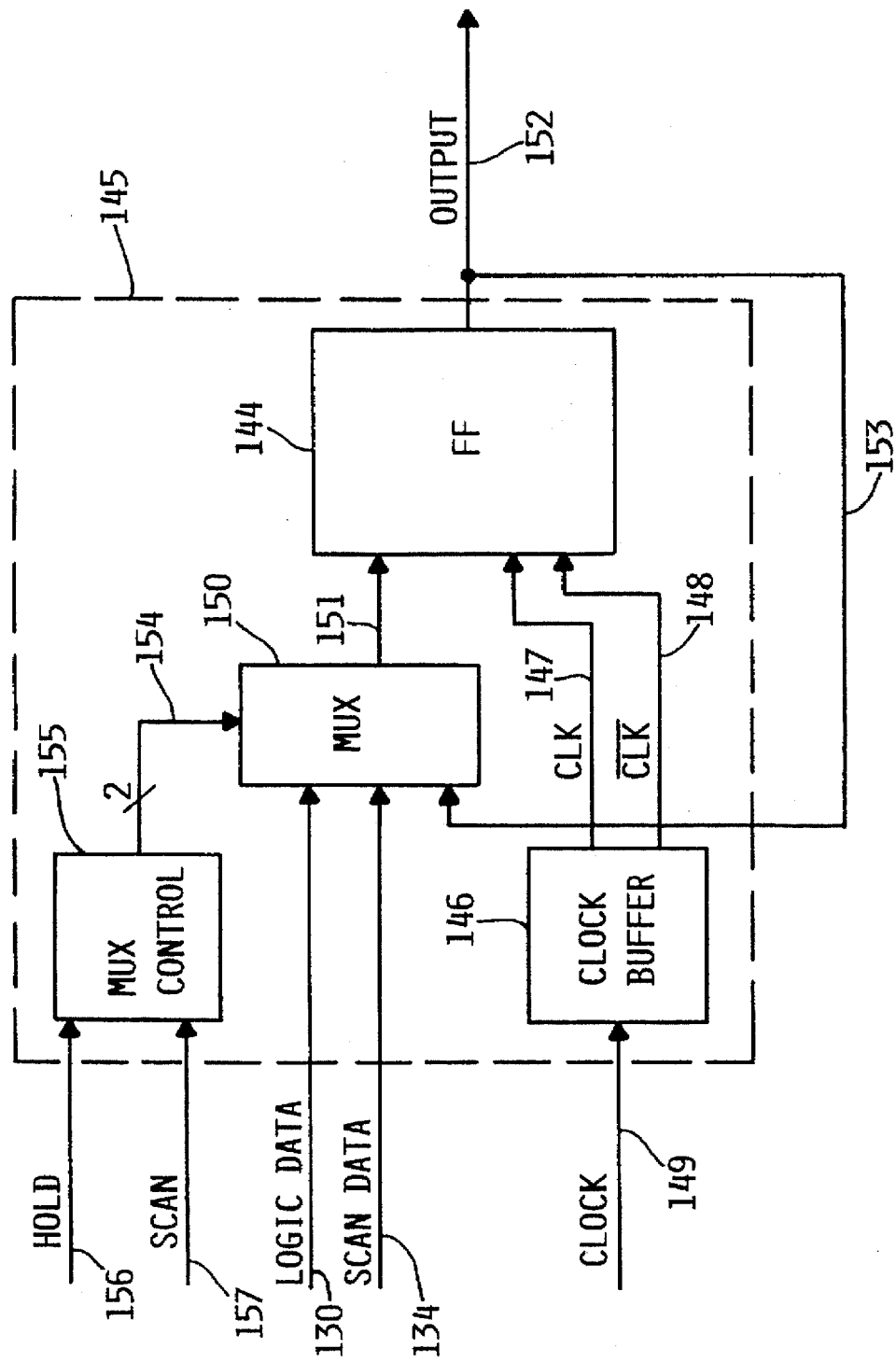
FIG. 4 is a block diagram of a Generalized Scan Design (GSD) latch as implemented in one embodiment of the invention.

FIG. 4 is a diagram of another embodiment of the circuitry used to propagate scan data bits through a scan chain. The scannable flip-flop 144 is part of the Generalized Scan Design (GSD) latch 145. Such a GSD latch 145 can be used rather than the shift register latches, such as SRL 120 of FIG. 3. A GSD latch is generally any type of scannable latch, and the GSD latch 145 of FIG. 4 includes a scannable flip-flop 144 where the scan function is realized by controlling the data inputs.

Referring to FIG. 4, the scannable flip-flop, labeled FF 144, receives a clock signal and an inverted clock signal from the clock buffer 146 via lines 147 and 148 respectively. The clock buffer 146 buffers the clock input signal on line 149. The data to be latched by FF 144 is received from the multiplexer labeled MUX 150 via line 151. MUX 150 receives the logic data on line 130, the scan data on line 134 and the output data from FF 144. The output data from FF 144 is outputted on line 152, and fed back to the MUX 150 via feedback line 153. The MUX 150 also receives multiplexer control signals from control bus 154. These multiplexer control signals designate which of the multiplexer input signals on lines 130, 134 and 153 will be selected as the output to MUX 150 on line 151. The MUX control 155 provides the multiplexer control signals on control bus 154 according to inputs received at the multiplexer control inputs, labeled the Hold signal on line 156 and the Scan signal on line 157.

A scan chain designed with GSD latches 145 is designed to provide outputs on line 152, yet control simultaneous switching between different scan chains. The signals inputted to the MUX control 155 of FIG. 4 allow the simultaneous switching to be controlled, and are labeled the Hold signal on line 156 and the Scan signal on line 157. When the Scan signal on line 157 is activated, the Scan Data signal on line 134 is selected to be the output to the MUX 150 on line 151. When the Hold signal on line 156 is activated, the output signal on line 152, and therefore on feedback line 153, is selected to be the output to the MUX 150 on line 151. The Hold signal "holds" the last output of the GSD latch 145 at its present value by way of the feedback. By controlling the Scan and Hold signals, simultaneous switching between scan chains can be controlled.

For instance, where four scan chains are present, a first scan chain will activate the Scan signal on line 157 on a first cycle of the clock signal on line 149, while the second, third and fourth scan chains activate the Hold signal on line 156. Therefore, only the first scan chain will be shifting in the scan data on the first clock cycle. On the next clock cycle, the first scan chain activates the Hold signal on line 156, the third and fourth scan chains continue to assert the Hold signal, and the second scan chain activates the Scan signal on line 157. This process continues until each of the scan chains have had their respective scan data shifted in. In this way, the scan chains can have scan data "concurrently", but not "simultaneously", shifted in.

The GSD latch 145 of FIG. 4 and the SRL 120 of FIG. 3 serve the same purpose, which is to create a scan chain in which the scan data can be shifted. Therefore, as will be appreciated by those skilled in the art, the SRL 120 and the GSD latch 145 are illustrative, and the invention can be used in conjunction with these and other latching mechanisms. This detailed description is described in terms of the SRL 120, however it should be recognized that these principals can be readily applied to GSD latches 145 or other latching mechanisms by those skilled in the art.

Figure 5:
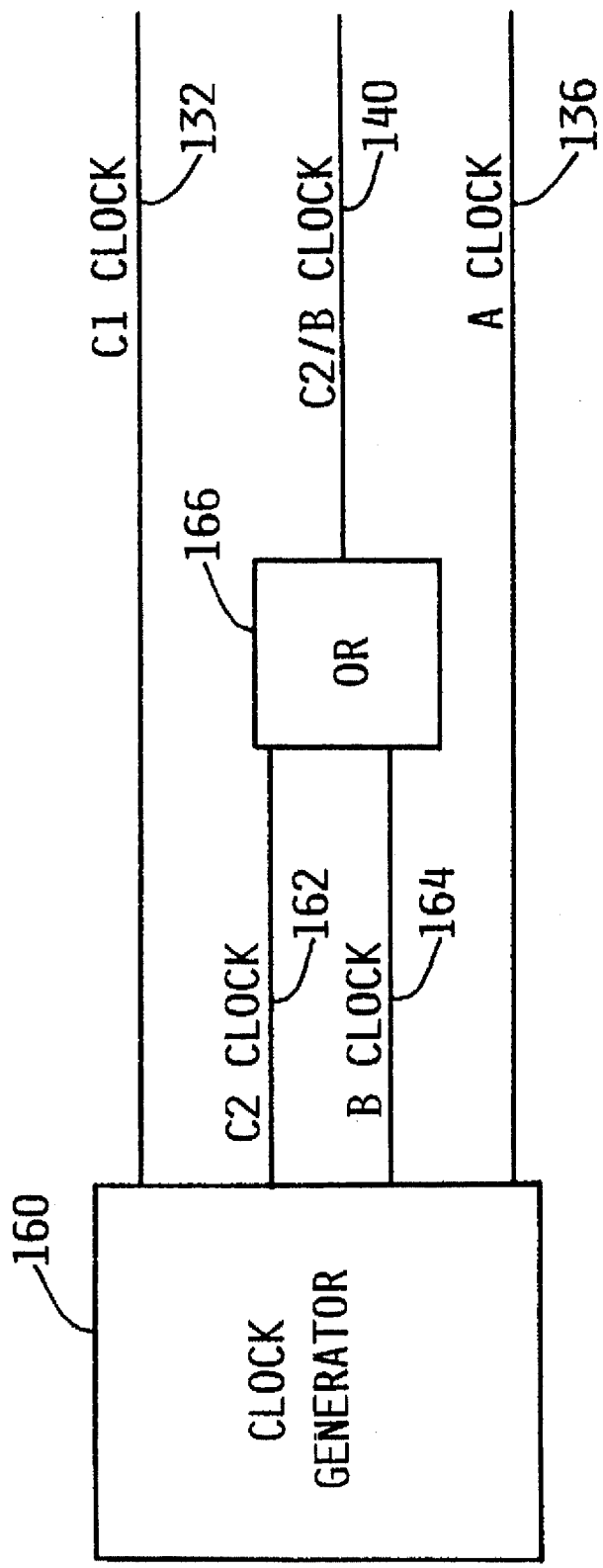
FIG. 5 is a block diagram illustrating the origin of the C1 clock signal, the C2/B clock signal, and the A clock signal.

FIG. 5 is a diagram showing the origin of the C1 clock signal on line 132, the C2/B clock signal on line 140, and the A clock signal on line 136. Clock generator 160 directly generates the C1 clock signal on line 132, and the A clock signal on line 136. Clock generators such as clock generator 160 are well known in the art. The C1 clock signal on line 132 is a functional clock signal which is used to clock the functional logic under test and during normal functional use.

The A clock signal on line 136 is used to propagate scan data bits through the SRLs. The C2 clock signal on line 162 is a second functional clock used to clock the functional logic at different times than the C1 clock signal on line 132. The B clock signal on line 164 is a second scan clock used to clock the L2 latches in the SRLs. The C1 clock signal and the C2 clock signal, on lines 132 and 162 respectively, clock the release and capture functions later described. The A clock signal and the B clock signal on lines 136 and 164, respectively, are used to perform the scan shift function in a scan chain having shift register latches such as SRL 120. In one embodiment, clock generator 160 does not simultaneously generate functional clock signals and scan clock signals. Therefore, when the C1 clock on line 132 and the C2 clock on line 162 are active, the A clock and B clock on lines 136 and 164 respectively will be inactive. Since the C2 clock on line 162 and the B clock on line 164 will not be operative simultaneously, they can be input into the OR function block 166 to generate the C2/B clock signal on line 140. By combining these clock signals, the C2/B clock signal on line 140 can be input into the clock (CLK) input of latch L2 124 so that the B clock signal is active during scanning, and the C2 clock signal is active for the release and capture functions which are described more fully below.

Figure 6:
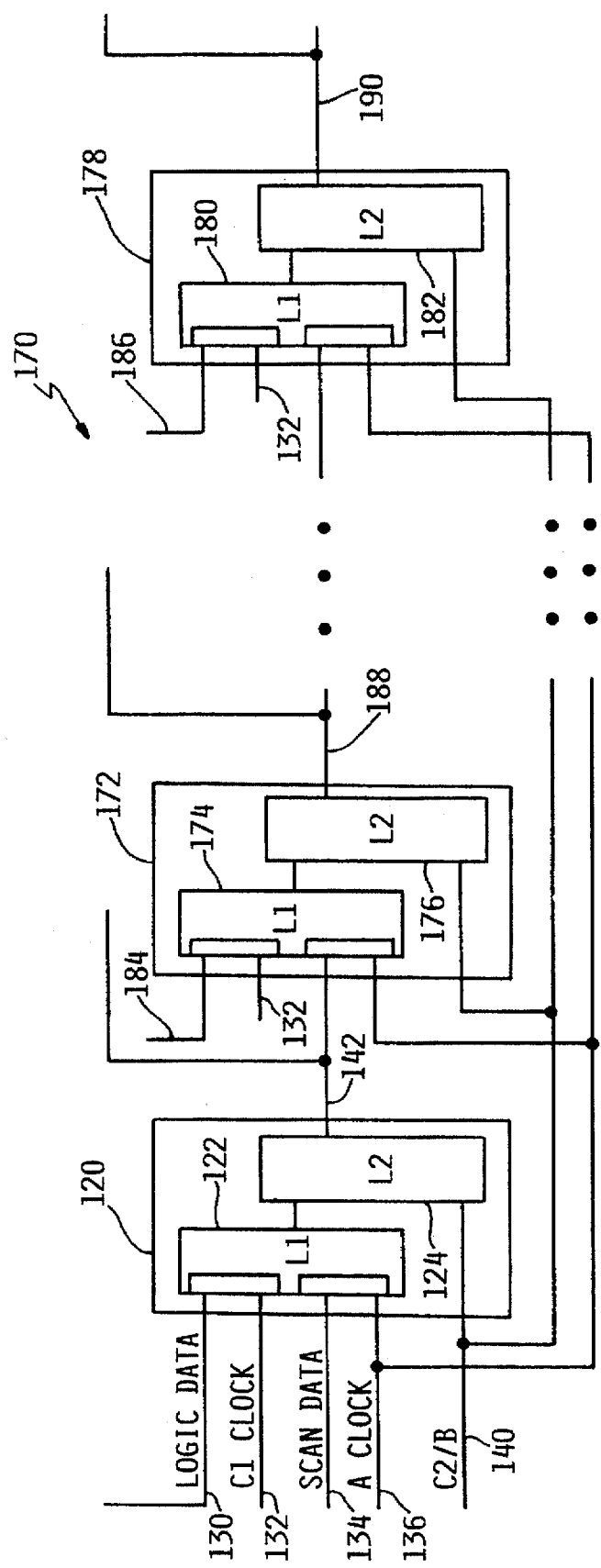
FIG. 6 is a diagram of a scan chain and its associated inputs.

FIG. 6 is a diagram of a scan chain 170 as implemented in one embodiment of the invention. SRL 120 having latch L1 122 and latch L2 124 is shown in a series with SRL 172 having latch L1 174 and latch L2 176. A number of other SRLs can be placed in series with SRL 120 and SRL 172 to provide a scan chain 170 of a desired length. The last SRL in scan chain 170 is shown as SRL 178 having latch L1 180 and latch L2 182. The A clock signal on line 136 is coupled to the latch L1 122, 174, through 180, of SRLs 120, 172, through 178 respectively. Similarly, the C2/B clock signal on line 140 is coupled to the L2 latches of SRLs 120, 172 through 178. A serial pattern of test bits is entered as scan data on line 134, and each of the test bits is propagated through the scan chain 170 until all of the test bits are latched into the SRLs.

Logic data on lines 130, 184, through 186 are inputted in parallel from the functional logic (not shown) to capture data from the functional logic that was generated as a result of applying the test bits latched in SRLs 120, 172, through 178 to the functional logic. When the scan data on line 134 has been shifted into each of the SRLs, a release occurs when the C2 clock signal on line 162 of FIG. 5 pulses to release the latched test bits in the L2 latches 124, 176, through 182 onto output lines 142, 188, through 190. The functional logic will then act on these test bits, and the resulting functional logic outputs are inputted as the logic data signals on lines 130, 184, through 186. An active pulse of the C1 clock signal on lines 132 then captures the logic data signals in latch L1 122, latch L1 174, through latch L1 180. The captured data can then be shifted out in the same manner that the scanned data was originally shifted in. In sum, scan data on line 134 is shifted into each of the SRLs to then be released into the functional logic on the occurrence of an active pulse on the C2/B clock signal on line 140, thereby providing logic data from the functional logic on lines 130, 184, and 186, which are captured and shifted out of the SRLs to be compared to an expected functional logic bit pattern.

Figure 7:
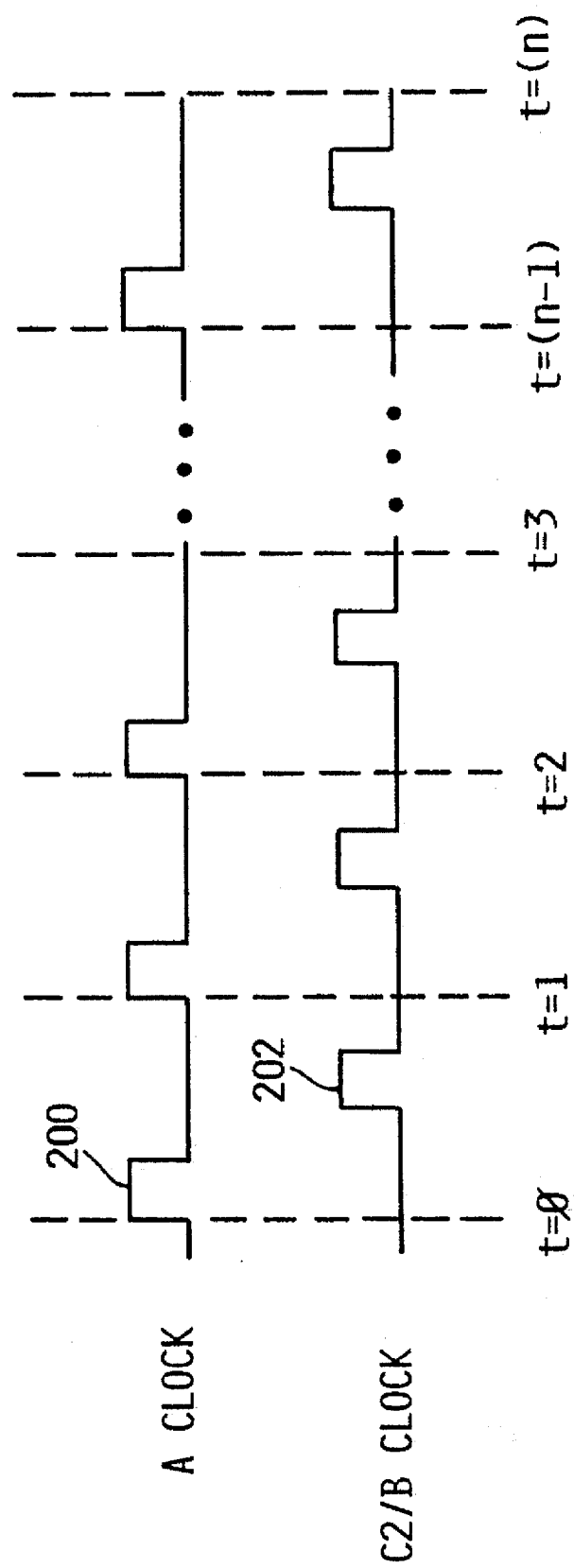
FIG. 7 is a waveform diagram illustrating the timing relationship between the A clock signal and the B clock signal for performing a scan shift operation.

FIG. 7 shows the timing relationship between the A clock signal and the B clock signal for performing a scan shift operation. Referring now to FIGS. 6 and 7, an active pulse 200 of the A clock signal on line 136 is inputted into SRL 120 at time t=0. Pulse 200 propagates a scan data bit on line 134 to latch L2 124 of SRL 120. A pulse 202 of the C2/B clock on line 140 latches the scan data bit at the output of latch L2 124 on line 142. The time between time t=0 and t=1 is defined as one scan shift. A successive scan shift occurs between times t=1 and t=2 to propagate the scan data bit from line 142 through SRL 172 to the output latch L2 176 of SRL 172 on line 188. The scan data bit continues to propagate through scan chain 170 through time t=(n). It should be noted that the C2/B clock on line 140 is driven by the B clock on line 164 of FIG. 5 during the scan shift operation. Scan shifting through scan chain 170 will terminate when all of the serial scan data bits on line 134 have been shifted into SRLs 120, 172, through 178. At this time, a release and subsequent capture will transpire in order to latch the resulting logic data from the functional logic into the SRLs.

As can be seen from FIGS. 6 and 7, the A clock and the B clock on lines 136 and 140 respectively could be coupled to a large number of SRLs in a large scan chain. Application-specific integrated circuits (ASICs) can have thousands of SRLs in a scan chain. Furthermore, an ASIC can have multiple scan chains each having thousands of SRLs. This can result in the simultaneous scan shifting of a very large number of SRLs, exceeding 100,000 or more. As will be appreciated by those skilled in the art, this massive simultaneous switching activity can result in excessive noise which can cause inadvertent test failures. Furthermore, the simultaneous switching can result in a large change in power supply current that can generate induced voltages, which can further compromise the testing procedures. The present invention reduces simultaneous switch problems by dividing the chip under test into clusters, each cluster including one or more scan chains of interest plus scan chains in the immediate vicinity to add up to a maximum allowable switching quantity.

Figure 8:
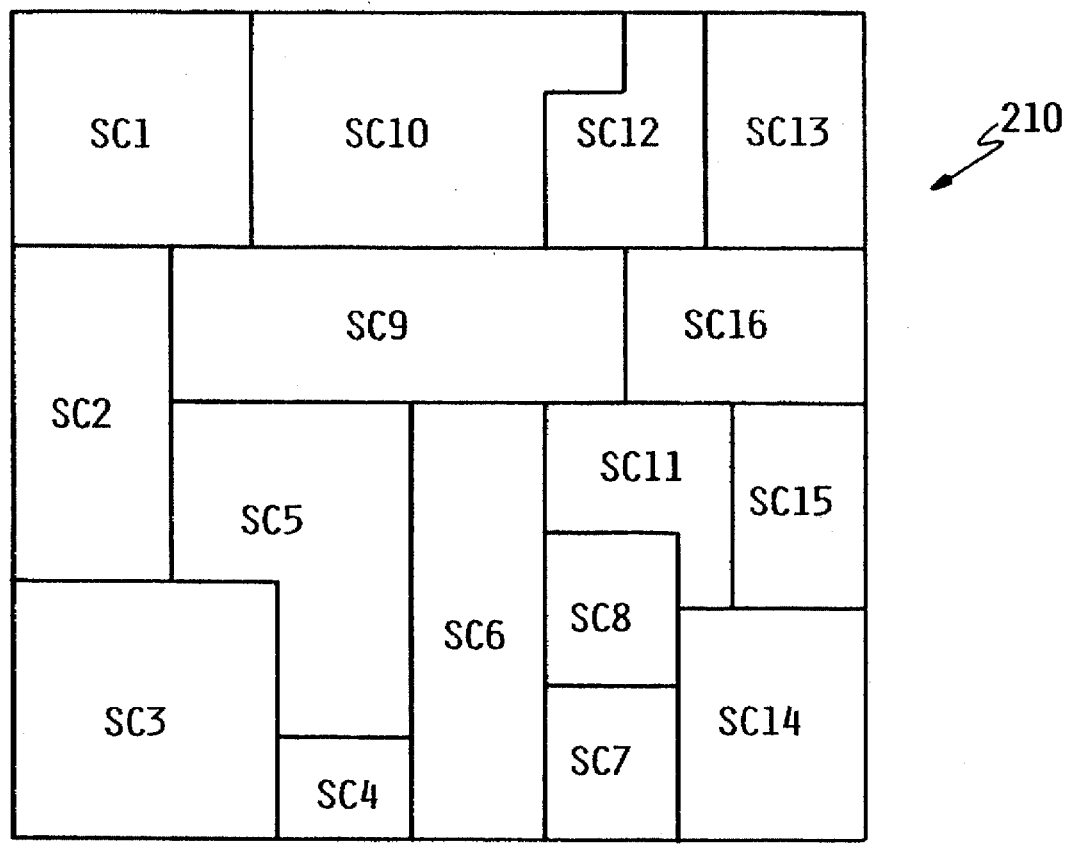
FIG. 8 is a representative diagram of the system logic under test having multiple scan chains.

FIG. 8 is a representative diagram of an application-specific integrated circuit (ASIC) 210 having 16 scan chains. Each of the scan chains is similar to scan chain 170 of FIG. 6. For instance, SC1 will perform a scan shift operation, and allow a release and capture function to test the functional logic being targeted by SC1. Functional logic associated with SC2 through SC16 is tested in a similar manner. It should be noted that the present invention applies equally as well to multiple ASICs, each having scan chains, as well as to a single ASIC 210.

Figure 9:
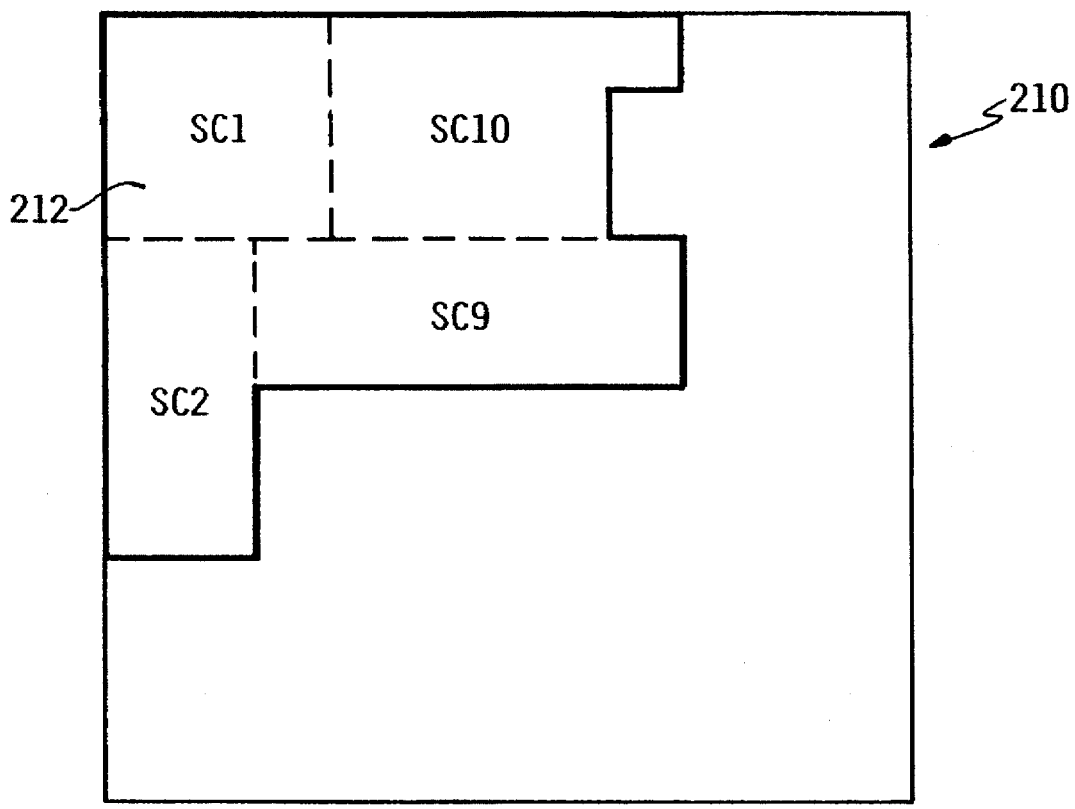
FIG. 9 is a diagram of one cluster of the system logic under test.

Referring now to FIG. 9, a cluster 212 including SC1, SC2, SC9 and SC10 is shown. A shift operation can be simultaneously performed on all of the scan chains in cluster 212. Other clusters in ASIC 210 can be clocked at times which are offset from the clocking times for performing shift operations in cluster 212.

Figure 10:
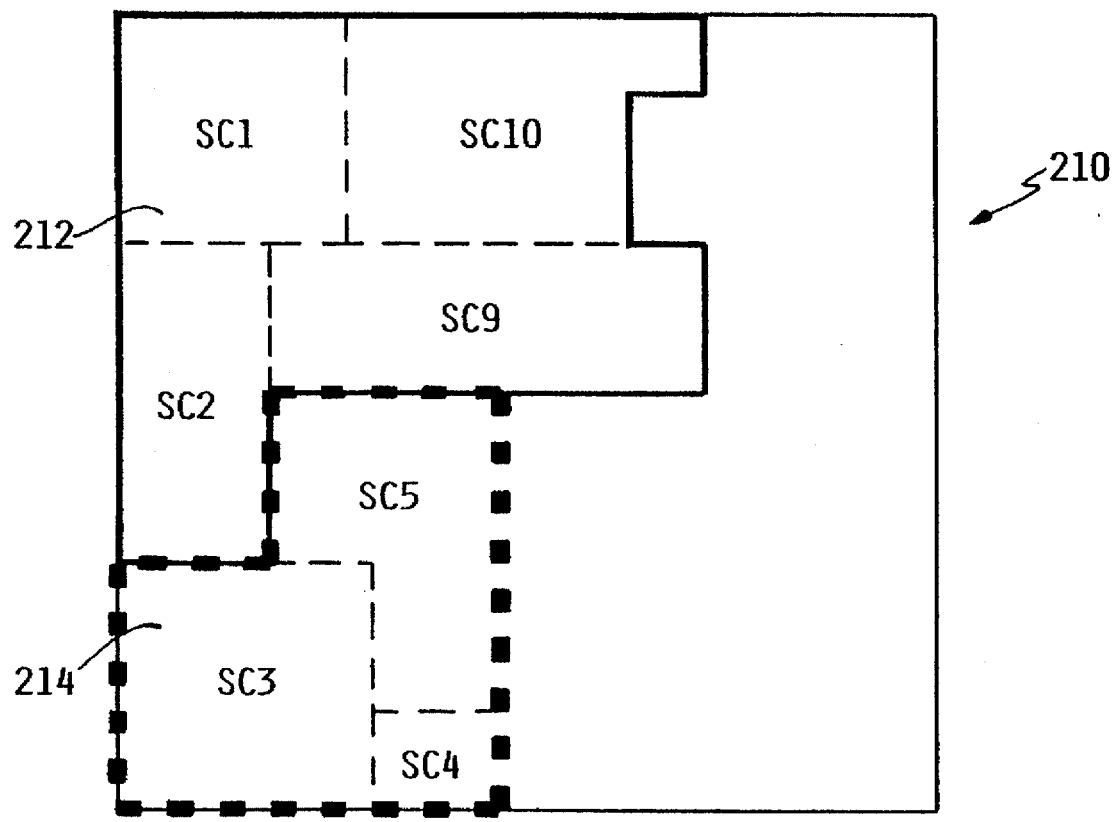
FIG. 10 is a diagram of two clusters of the system logic under test.

Referring now to FIG. 10, a second cluster 214 is shown in ASIC 210. Cluster 214 includes scan chains SC3, SC4 and SC5. Cluster 214 performs shift operations at a time offset from that of the shift operations performed within cluster 212. Therefore, the switching occurring in cluster 212 does not occur simultaneously with the switching occurring in cluster 214, thereby reducing overall simultaneous switching. In order to perform offset shift operations in multiple clusters, an offset, or "phase-shifted" clocking technique is implemented.

To reduce simultaneous switching during the advancement of test bits through the scan chains, scan clock grouping is used. One scan clock group clocks the scan chains in one cluster, and another scan clock group clocks the scan chains in another cluster. Each scan clock group is offset in time from other scan clock groups so that the scan chains of different clusters are not clocked at exactly the same time, although the scan chains are all being clocked concurrently. In other 5 words, the scan chains of different clusters all have patterns of test bits being propagated through the scan chains during the same time interval, but the actual clock pulses are offset or phase-shifted to spread out the actual shift instances.

Figure 11:
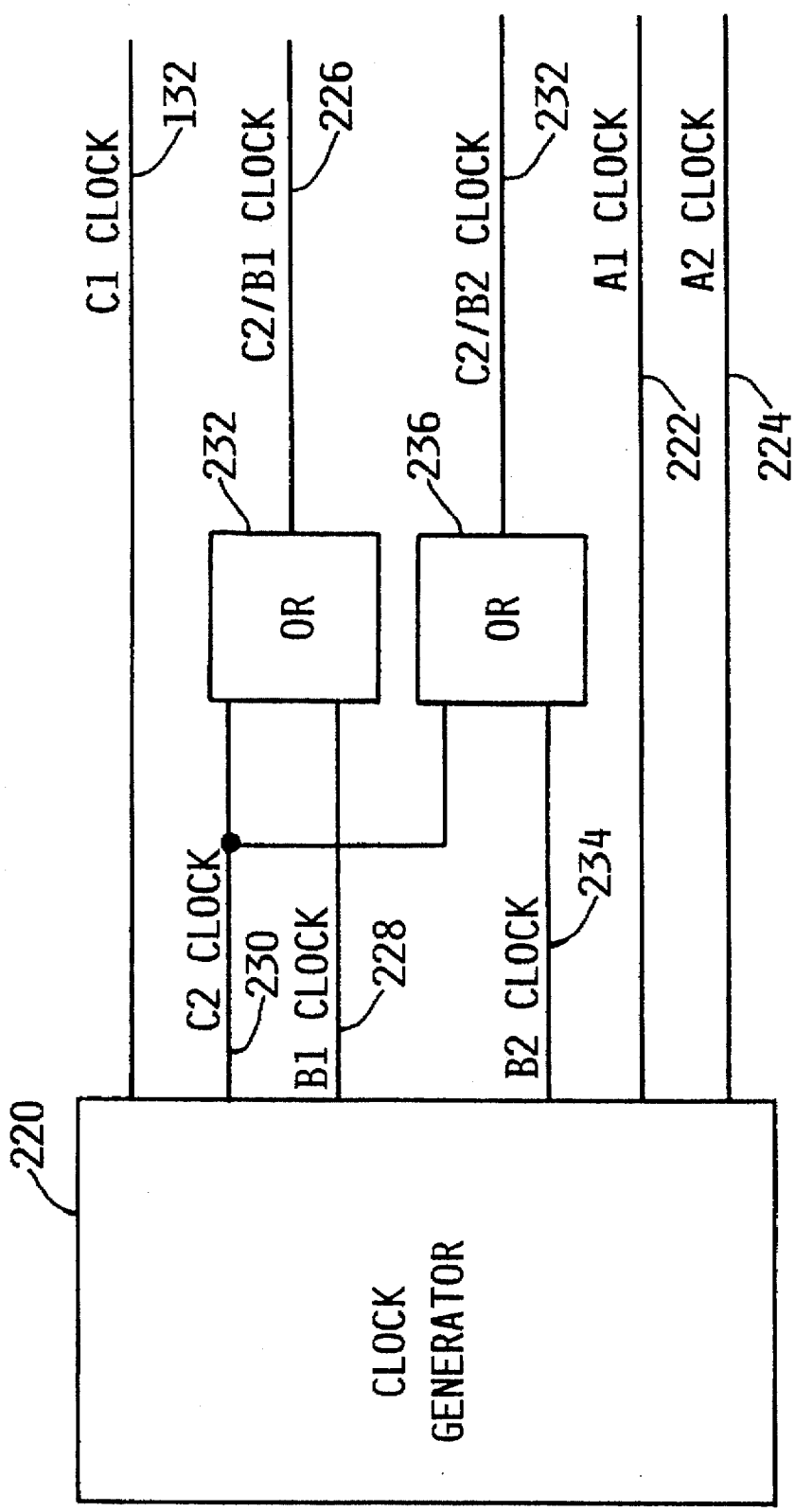
FIG. 11 is a block diagram illustrating the generation of multiple scan clock groups.

Referring now to FIG. 11, the generation of multiple scan clock groups is shown. Where one or more chips under test are logically divided into two clusters, two scan clock groups are used. A first scan clock group is used to clock the scan shifts in the first cluster, and a second scan clock group is used to clock the scan shifts in a second cluster.

Clock generator 220 generates a C1 clock signal on line 132 as was described for clock generator 160 of FIG. 5. However, rather than generating one A clock signal and one C2/B clock signal as shown on lines 136 and 140 respectively of FIG. 5, two A clock and C2/B clock signals are generated by the clock generator 220 of FIG. 11. The A1 clock signal on line 222 and the A2 clock signal on line 224 each clock the scan chains in different clusters. For instance, the scan chains of cluster 212 of FIG. 10 will have their L1 latches in each SRL clocked by the A1 clock signal on line 222, and the scan chains of cluster 214 of FIG. 10 will have their L1 latches in each SRL clocked by the A2 clock signal on line 224.

The C2/B1 clock signal on line 226 is the B1 clock signal from line 228 during scan shift operations. The C2 clock signal on line 230 will be inhibited by the clock generator 220 during scan shift operations, thereby allowing the B1 clock signal on line 228 to pass through OR gate 232 to become the C2/B1 clock signal on line 226. Likewise, the C2/B2 clock signal on line 232 is the B2 clock signal from line 234 during scan shift operations, because the B2 clock signal on line 234 will pass through OR gate 236 to become the C2/B2 clock signal on line 232. The C2/B1 clock signal on line 226 and the C2/B2 clock signal on line 232 also each clock the scan chains in different clusters. For instance, the scan chains of cluster 212 of FIG. 10 will have their L2 latches in each SRL clocked by the C2/B1 clock signal on line 226, and the scan chains of cluster 214 of FIG. 10 will have their L2 latches in each SRL clocked by the C2/B2 clock signal on line 232. Note that it is not necessary to pair the A1 and B1 signals, since the A1 and B2 signals could actually be "paired", as long as the switching is not occurring simultaneously.

Figure 12:
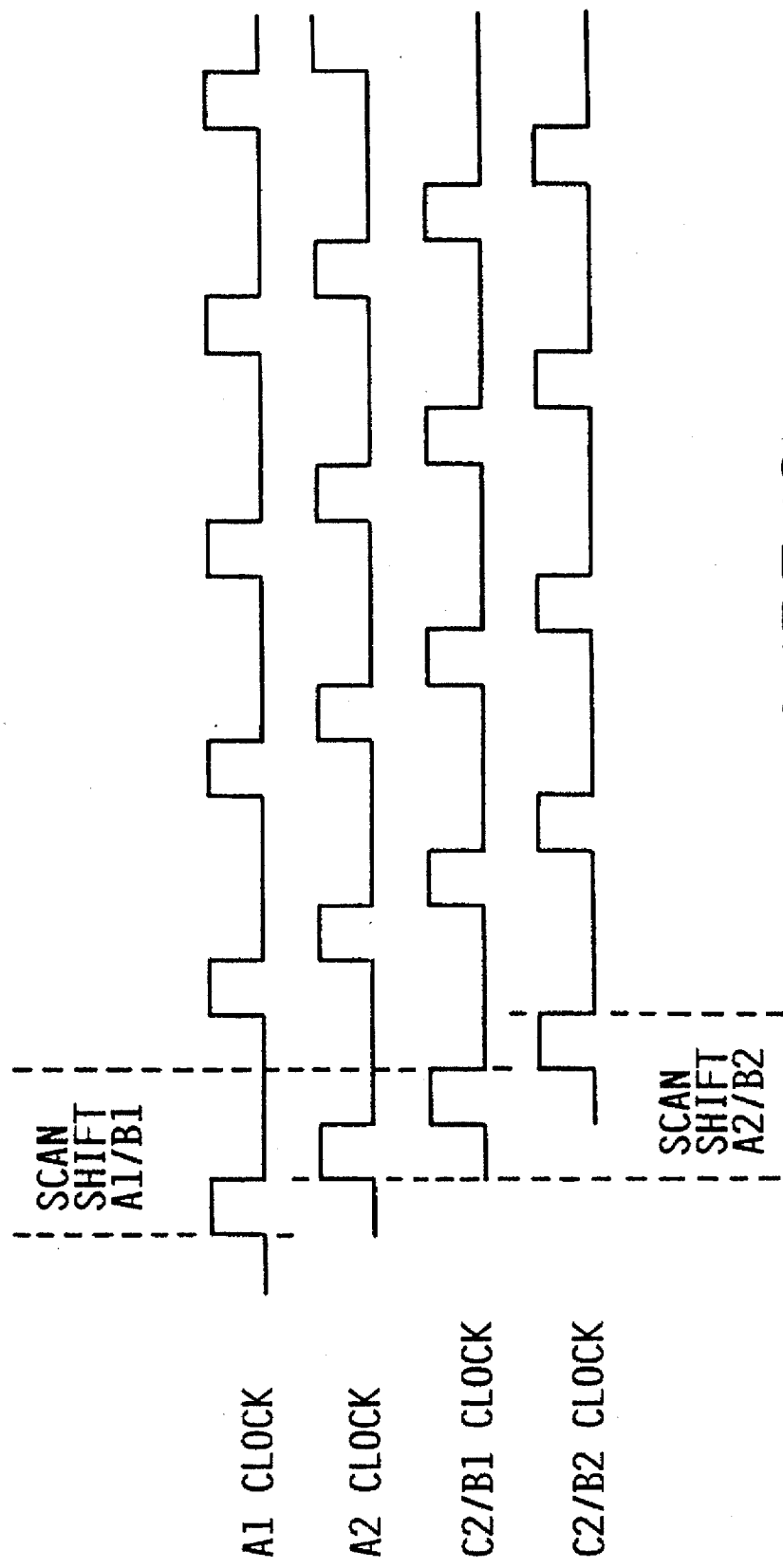
FIG. 12 is a waveform diagram illustrating the relationship of the two scan clock groups.

FIG. 12 is a waveform diagram showing the relationship of the scan clock groups. Referring now to FIGS. 11 and 12, the A1 clock signal on line 222 and the C2/B1 clock signal on line 226 jointly make up a first scan clock group which clocks a series of scan shifts A1/B1. The A1 clock signal and the C2/B1 clock signal operate analogously to the A clock signal and the C2/B clock signal of FIG. 7. The scan clock group including the A1 clock signal and the C2/B1 clock signal clock a first cluster, such as cluster 212 of FIG. 10.

The A2 clock signal on line 224 and the C2/B2 clock signal on line 232 jointly make up a second scan clock group which clocks a series of scan shifts A2/B2. This scan clock group clock a second cluster, such as cluster 214 of FIG. 10. Although concurrently performing scan shift operations, the shift transactions for the scan chains of cluster 212 are offset in time from the shift transactions for the scan chains of cluster 214. Therefore, the latches in the shift register latches (SRLs) of cluster 212 are not switching simultaneously with the latches in the SRLs of cluster 214. As will be appreciated by those skilled in the art, additional scan clock groups can be similarly constructed to perform offset clocking of additional clusters.

Figure 13:
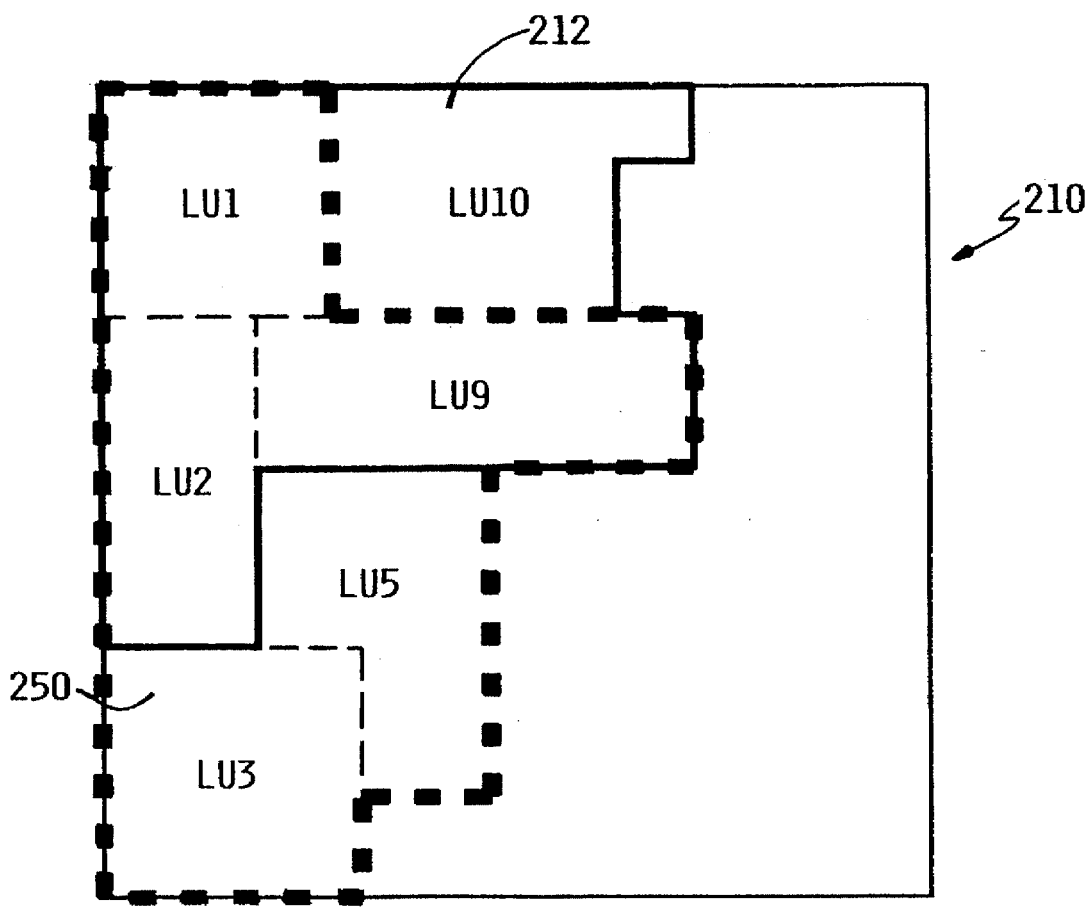
FIG. 13 is a diagram of two overlapping clusters of the system logic under test.

Referring now to FIG. 13, logic cluster 212 is shown overlapping another logic cluster 250. Logic clusters are created by logically dividing the ASIC 210 into groups of logical units that can overlap as shown in FIG. 13. These differ from scan clusters, where scan clusters are those regions including common scan chains. Logical units LU1, LU2, and LU9 are part of logic cluster 212 and logic cluster 250. This overlapping effect allows for inter-partition testing between logical units of multiple clusters. If overlapping of clusters was not used, logic interactions between logical units of different clusters may not be adequately tested. By "overlapping" the clusters, these interactions can be tested.

When performing scan shift operations, the scan chains associated with the overlapped area including logical units LU1, LU2 and LU9 are only shifted once even though they reside in two logic clusters. This can be accomplished by enabling the corresponding clock signals generated by the clock generator 220 of FIG. 11 when one of the two clusters is being clocked, and disabling those clock signals when the other overlapped cluster is being clocked. Such enabling and disabling of clock signals is known in the art, and can be effected by controlling the clock drivers in the clock generator 220, or by using Boolean AND functions or other known techniques.

Figure 14:
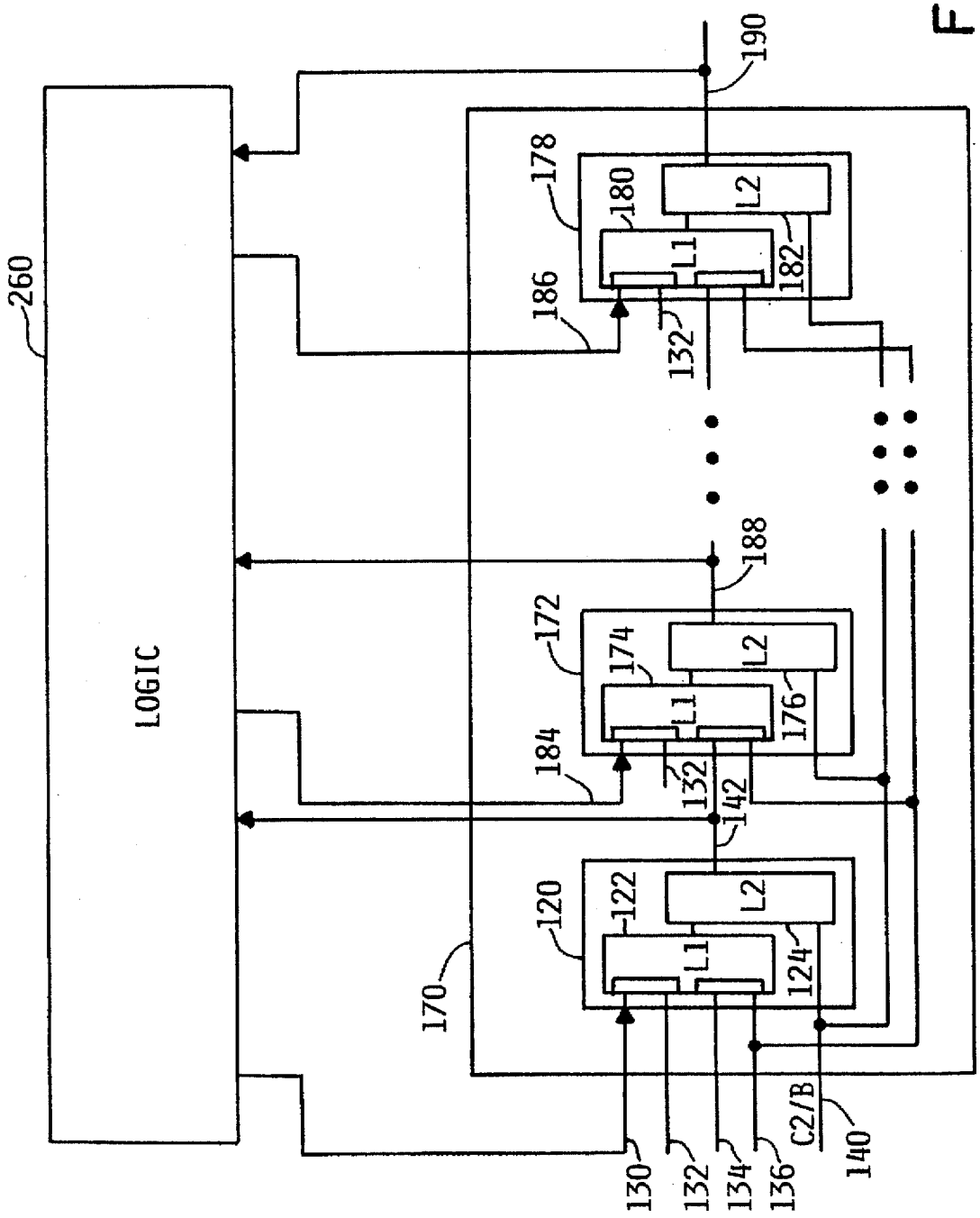
FIG. 14 is a block diagram illustrating the release and capture functions associated with a scan chain coupled to the system logic under test.

FIG. 14 illustrates the release and capture functions. The design logic to be tested, labeled logic 260, is shown connected to scan chain 170. When all of the scan data bits from line 134 have been stepped through scan chain 170, the scan data bits are ready to be "released" to the logic 260. The scan data bits are released on output lines 142, 188 through 190 of SRLs 120, 172 through 178 respectively, which become inputs to the logic 260. This release is effected on a pulse of the C2/B clock signal on line 140, which is representative of either the C2/B1 clock signal on line 226 of FIG. 11, or the C2/B2 clock signal on line 232 of FIG. 11. The C2/B clock signal on line 140 is driven during the release function by the C2 clock on line 230 of FIG. 11. The logic 260 receives the scan data bits, and acts upon the bits as though it were operating under normal circumstances. The outputs of the logic 260 are then returned to scan chain 170 to be "captured". It should be noted that a different scan chain could perform the capture function.

In order to capture the logic test results, scan chain 170 receives the logic test results as logic data on lines 130, 184 through 186 of SRLs 120, 172 through 178 respectively. The logic data will be captured on a triggering edge of the C1 clock on line 132 of each of the SRLs 120, 172 through 178.

Figure 15:
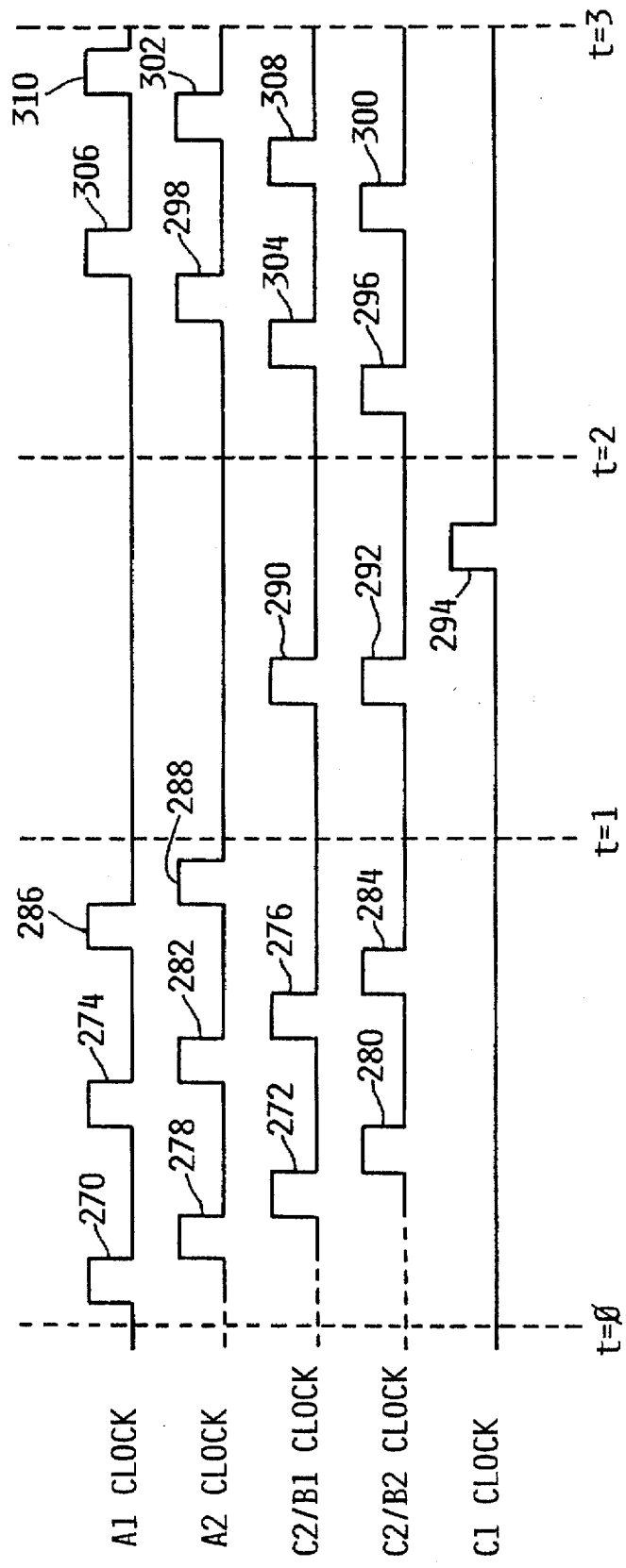
FIG. 15 is a waveform diagram illustrating the timing of the release and capture functions.

FIG. 15 illustrates the timing of the release and capture functions. Referring to FIGS. 11 and 15, the A1 clock signal on line 222 and the C2/B1 clock signal on line 226 perform two final scan shift operations, as seen by pulses 270, 272, 274 and 276 between times t=0 and t=1. Similarly, the A2 clock signal on line 224 and the C2/B2 clock signal on line 232 perform two final scan shift operations, as seen by pulses 278, 280, 282 and 284 between times t=0 and t=1. Pulses 286 and 288 clock the last scan data bit in each scan chain to the output of the L1 latches of each of the SRLs in order to move the scan data bits to the input of the L2 latches of the SRLs to prepare the L2 latches to release the scan data bits. At some time after time t=1, the C2/B1 clock signal on line 226 and the C2/B2 clock signal on line 232 pulses as a result of a pulse on the C2 clock signal on line 230. These pulses are shown as pulses 290 and 292, which trigger the "release" of the scan data bits. At this time, the logic being tested can act on the scan data bits, and return the logic test results to the scan chain. Pulse 294 of the C1 clock signal on line 132 then captures the logic test results in the L1 latches of the SRLs.

As shown between times t=2 and t=3, the logic test results are then shifted out of the scan chains to be compared to an expected test result. The scan shift pulses in this example occur in a reverse order from that of the input of the scan data bits, and therefore the B clock signals leads the A clock signals. The C2/B2 clock signal on line 232 and the A2 clock signal on line 224 perform a series of scan shifts, the first two of which are shown between times t=2 and t=3 as pulses 296, 298, 300 and 302. Similarly, the C2/B1 clock signal on line 226 and the A1 clock signal on line 222 perform a series of scan shifts, the first two of which are shown between times t=2 and t=3 as pulses 304, 306, 308 and 310.

In the preferred embodiment of the invention, the release functions in different clusters are not performed simultaneously. This reduces simultaneous switching that would occur by simultaneously releasing the data bits of all of the scan chains into their respective logic segments to be tested. Therefore, the present invention offsets the release times of each of the clusters. The capture times are also offset, in order to reduce simultaneous switching that would occur if each of the scan chains simultaneously captured the logic test results.

Figure 16:
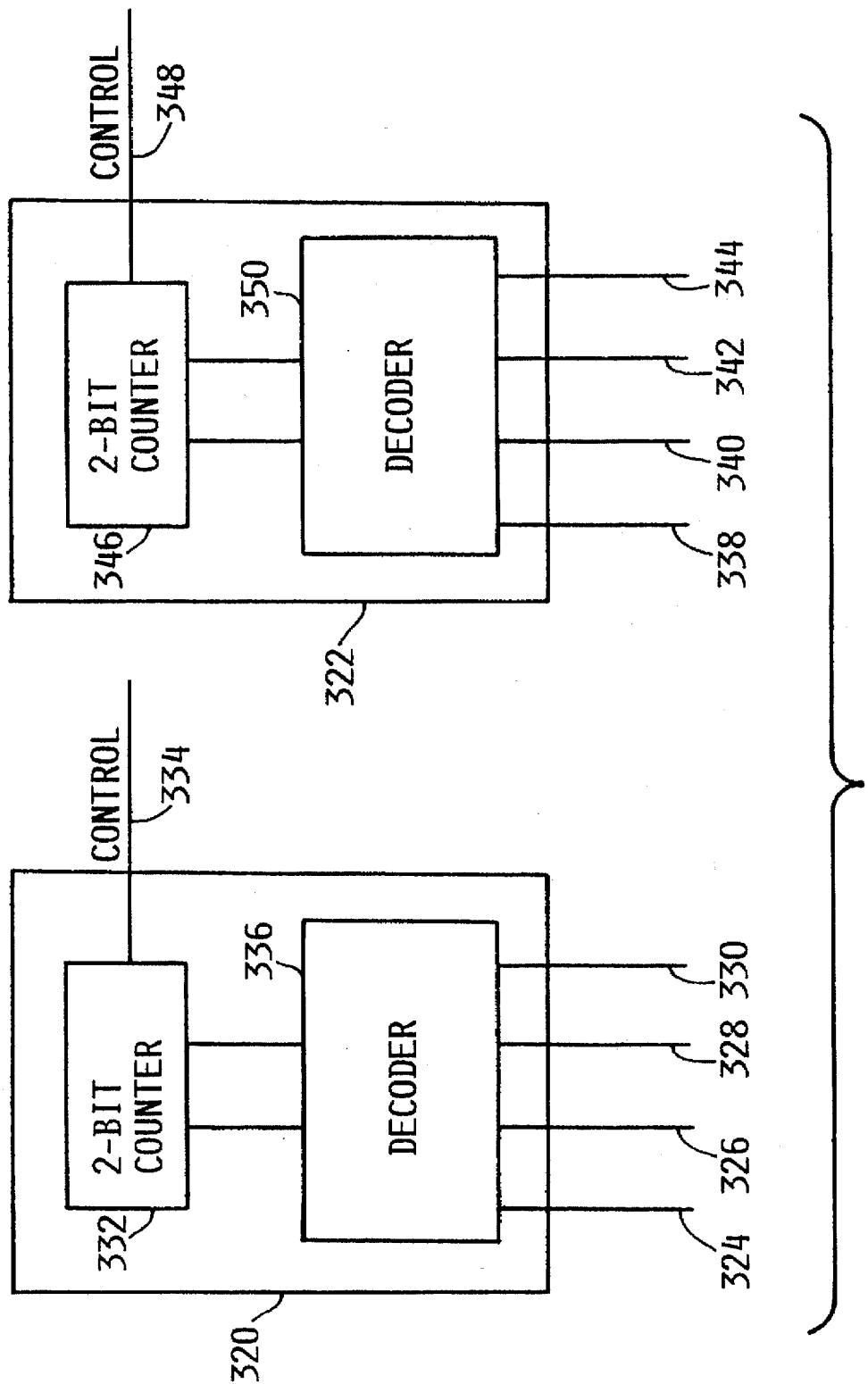
FIG. 16 is a block diagram of a release sequencer and a capture sequencer for controlling the timing of the release and capture functions.

Referring now to FIG. 16, a block diagram of a release sequencer 320 and a capture sequencer 322 is shown. These sequencers provide control over the times in which release and capture operations occur. In order to prevent multiple clusters from releasing at the same time and capturing at the same time, the release and capture times are set to occur in predetermined sequences. Working together, release sequencer 320 and capture sequencer 322 also allow control of the timing of release operations relative to the capture operations.

Release sequencer 320 of FIG. 16 would be used in a system having four clusters. Therefore, four release control outputs 324, 326, 328 and 330 are required. A 2-bit counter 332, controlled by a control signal on line 334, counts from 0 to 3. The outputs of the counter 332 are decoded by decoder 336 to generate output signals on the release control outputs 324, 326, 328 and 330. Only one of the control outputs will be active at any given time. This results in a pattern on release control outputs (RCO) 324, 326, 328 and 330 as shown in Table 1 below:

TABLE 1

| RCO 324 | RCO 326 | RCO 328 | RCO 330 |
|---|---|---|---|
| 0 | 0 | 0 | 1 |
| 0 | 0 | 1 | 0 |
| 0 | 1 | 0 | 0 |
| 1 | 0 | 0 | 0 |

Similarly, capture sequencer 322 has four capture control outputs 338, 340, 342 and 344 are required. Another 2-bit counter 346, Controlled by a control signal on line 348, counts from 0 to 3. The outputs of the counter 346 are decoded by decoder 350 to generate output signals on the capture control outputs 338, 340, 342 and 344. Only one of the capture control outputs will be active at any given time. This results in a pattern on capture control outputs (CCO) 338, 340, and 344 as shown in Table 2 below:

TABLE 2

| CCO 338 | CCO 340 | CCO 342 | CCO 344 |
| --- | --- | --- | --- |
| 0 | 0 | 0 | 1 |
| 0 | 0 | 1 | 0 |
| 0 | 1 | 0 | 0 |
| 1 | 0 | 0 | 0 |

The release sequencer 320 and the capture sequencer 322 prevent multiple clusters from releasing at the same time, and from capturing at the same time. However, the release sequencer 320 and capture sequencer also allow control of the timing of release operations relative to the capture operations. For instance, a first cluster could be allowed to release while another non-overlapped cluster could perform its capture. This can be accomplished by properly timing the control signals on lines 334 and 348. Table 3 shows the relationship between the release control outputs (RCO) 324, 326, 328 and 330, and the capture control outputs (CCO) 338, 340, 342 and 344:

TABLE 3

| RCO 324 | RCO 326 | RCO 328 | RCO 330 | CCO 338 | CCO 340 | CCO 342 | COO 344 |
| --- | --- | --- | --- | --- | --- | --- | --- |
| 0 | 0 | 0 | 1 | 0 | 0 | 0 | 1 |
| 0 | 0 | 0 | 1 | 0 | 0 | 1 | 0 |
| 0 | 0 | 0 | 1 | 0 | 1 | 0 | 0 |
| 0 | 0 | 0 | 1 | 1 | 0 | 0 | 0 |
| 0 | 0 | 1 | 0 | 0 | 0 | 0 | 1 |
| 0 | 0 | 1 | 0 | 0 | 0 | 1 | 0 |
| 0 | 0 | 1 | 0 | 0 | 1 | 0 | 0 |
| 0 | 0 | 1 | 0 | 1 | 0 | 0 | 0 |
| 0 | 1 | 0 | 0 | 0 | 0 | 0 | 1 |
| 0 | 1 | 0 | 0 | 0 | 0 | 1 | 0 |
| 0 | 1 | 0 | 0 | 0 | 1 | 0 | 0 |
| 0 | 1 | 0 | 0 | 1 | 0 | 0 | 0 |
| 1 | 0 | 0 | 0 | 0 | 0 | 0 | 1 |
| 1 | 0 | 0 | 0 | 0 | 0 | 1 | 0 |
| 1 | 0 | 0 | 0 | 0 | 1 | 0 | 0 |
| 1 | 0 | 0 | 0 | 1 | 0 | 0 | 0 |

As can be seen in Table 3, the release sequencer 320 and capture sequencer 322 of FIG. 16 allow control over the timing of the release and capture operations. As will be appreciated by those skilled in the art, the control signals on lines 334 and 348 can be manipulated to alter the counting process of the counters 332 and respectively, which provides a great deal of control over the timing of the release and capture functions. Furthermore, the release sequencer 320 and the capture sequencer 322 can be easily modified to accommodate a different number of clusters. For instance, if eight clusters were present, counters 332 and 346 would be 3-bit counters, the decoders 336 and 350 would be 3–8 decoders.

Figure 17:
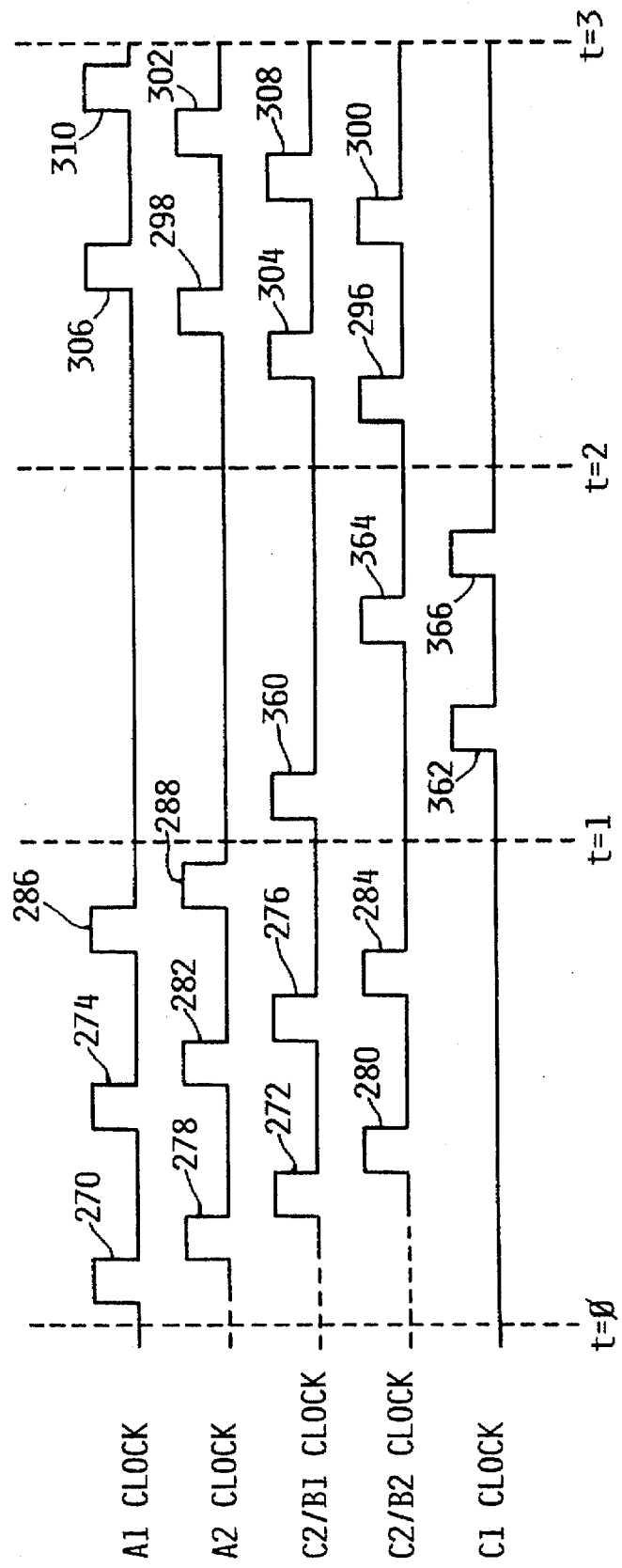
FIG. 17 is a waveform diagram illustrating the timing of the release and capture functions where the release sequencer and the capture sequencer regulate release and capture functions.

FIG. 17 illustrates the timing of the release and capture functions where the release sequencer 320 and the capture sequencer 322 regulate release and capture operations. As was described in connection with FIG. 15, the A1 clock signal on line 222 and the C2/B1 clock signal on line 226 perform two final scan shift operations, as seen by pulses 270, 272, 274 and 276 between times t=0 and t=1. Similarly, the A2 clock signal on line 224 and the C2/B2 clock signal on line 232 perform two final scan shift operations, as seen by pulses 278, 280, 282 and 284 between times t=0 and t=1. Pulses 286 and 288 clock the last scan data bit in each scan chain to the output of the L1 latches of each of the SRLs in order to move the scan data bits to the input of the L2 latches of the SRLs to prepare the L2 latches to release the scan data bits. At some time after time t=1, the C2/B1 clock signal pulses, shown as pulse 360, which triggers the release of the scan data bits into the cluster being clocked by the C2/B1 clock signal. The C2/B2 clock signal is inhibited as a result of the release sequencer 320. At this time, the logic in the cluster being clocked by the C2/B1 clock signal can act on the scan data bits, and return the logic test results to the scan chain. Pulse 362 of the C1 clock signal then captures the logic test results in the L1 latches of the SRLs. The C1 clock signal will only be allowed to clock one cluster, depending on the state of the capture sequencer 322. Other release and capture operations can be similarly performed, at times offset from other release and capture operations performed on other clusters, as shown by release pulse 364 and capture pulse 366.

As shown between times t=2 and t=3, the logic test results are then shifted out of the scan chains to be compared to an expected test result. As previously described, the scan shift pulses must occur in a reverse order from that of the input of the scan data bits, and therefore the B clock signals leads the A clock signals. The C2/B2 clock signal and the A2 clock signal perform a series of scan shifts as was described in connection with FIG. 15, the first two of which are shown between times t=2 and t=3 as pulses 296, 298, 300 and 302. Similarly, the C2/B1 clock signal and the A1 clock signal perform a series of scan shifts, the first two of which are shown between times t=2 and t=3 as pulses 304, 306, 308 and 310.

Figure 18:
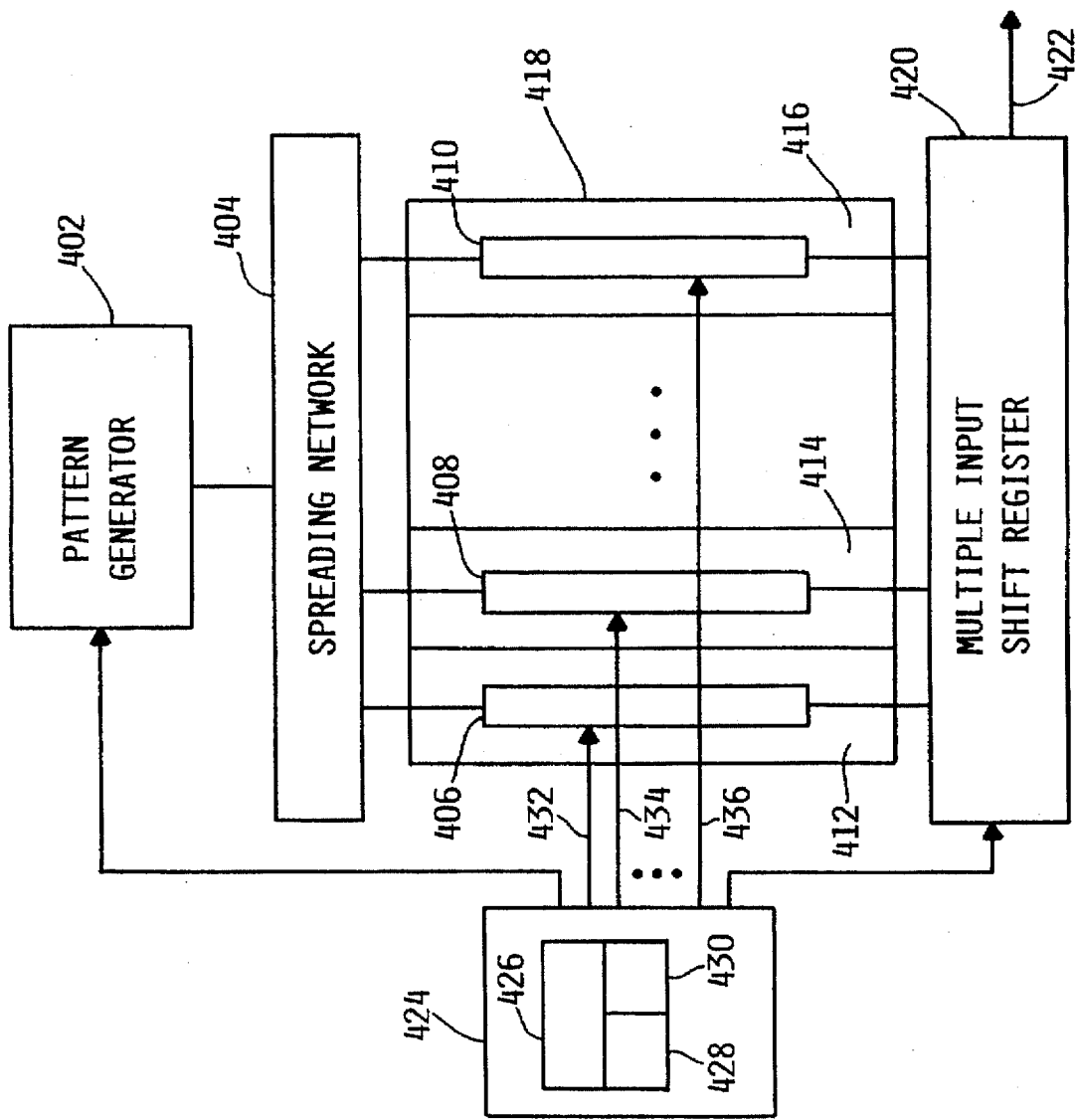
FIG. 18 is a block diagram of a testing system implementing the present invention.

FIG. 18 is a block diagram of a testing system 400 implementing the present invention. Pattern generator 402 generates the scan data bits which are patterns of test bits. The pattern generator 402 of the preferred embodiment is a pseudo-random pattern generator (PRPG) which implements an n-bit linear feedback shift register (LFSR) counter which has $2^n-1$ states. Such LFSR counters are known in the art, and will not be described further herein. Other pattern generators, including external testers, could also be utilized with the present invention.

The pattern generator is connected to a spreading network 404. Where there are multiple scan chains, the scan chains should not all be fed directly by the pseudo-random pattern generator (PRPG) of the preferred embodiment, so that the different scan chains receive different patterns of test bits. The spreading network 404 includes a number of exclusive-OR functions (not shown) that breaks up the patterns of test bits to be fed into the scan chains.

The spreading network 404 then supplies all of the scan chains with the scan data bits. FIG. 18 includes scan chains 406, 408, through 410 in clusters 412, 414, through 416 of system logic 418 respectively. The scan chains are each coupled to a multiple input shift register (MISR) 420, which compresses the logic test results into one binary value which is outputted on line 422 to be compared to an expected value.

The clock generator and control unit 424 includes a clock generator 426, such as clock generator 220 of FIG. 11. The clock generator and control unit 424 also includes a release sequencer 428 and a capture sequencer 430 such as release sequencer 320 and capture sequencer 322, respectively, of FIG. 16. The clock generator and control unit 424 provides groups of scan clock signals, including the shift, release, and capture clock signals, to the scan chains 406, 408, through 410 on lines 432, 434, through 436 respectively. The clock generator and control unit 424 can also be coupled to the PRPG 402 and the MISR 420, to control the times in which they are advanced by the scan clock signals.

The invention has been described in its presently contemplated best mode, and it is clear that it is susceptible to various modifications, modes of operation and embodiments, all within the ability and skill of those skilled in the art and without the exercise of further inventive activity. Accordingly, what is intended to be protected by Letters Patents is set forth in the following claims.

What is claimed is:

1. A method for reducing simultaneous switching during scan-based testing of system logic, the method comprising the steps of:

(a) dividing the system logic into a plurality of logic clusters and scan clusters, each scan cluster comprising one or more scan chains; and (b) concurrently performing scan-based test functions on designated ones of the logic clusters, comprising the steps of:

(i) generating scan control signals for each of the scan clusters;

(ii) offsetting triggering edges of each of the scan control signals from the active triggering edges of other ones of the scan control signals;

(iii) generating test control signals for each of the designated ones of the logic clusters; and (iv) controlling release and capture functions in the designated ones of the logic clusters with a different one of the test control signals.

2. The method of claim 1, wherein the step of dividing comprises the step of overlapping the logic clusters.

3. The method of claim 1, wherein the step of generating scan control signals comprises the step of generating scan-shift control signals for each of the designated scan clusters, to control the shifting of serial test patterns into the associated scan chains.

4. The method of claim 3, wherein each of the one or more scan chains associated with the designated scan clusters comprises a plurality of latch pairs, and wherein the step of generating scan-shift control signals for each of the designated scan clusters comprises the steps of:

(a) generating a first scan-shift clock signal for clocking a first latch in each of the plurality of latch pairs; and (b) generating a second scan-shift clock signal for clocking a second latch in each of the plurality of latch pairs.

5. The method of claim 4, wherein the step of generating scan-shift clock signals for each of the scan clusters further comprises the step of alternating shift pulses of the first and second scan-shift clock signals to alternately clock the first and second latches in the plurality of latch pairs.

6. The method of claim 4, wherein the step of offsetting triggering edges comprises the step of offsetting shift pulses of the first and second scan-shift clock signals associated with a particular one of the scan clusters from the shift pulses of the first and second scan-shift clock signals associated with other ones of the scan clusters.

7. The method of claim 3, wherein each of the one or more scan chains associated with the scan clusters comprises a plurality of scannable flip-flops, and wherein the step of generating scan-shift control signals for each of the designated scan clusters comprises the step of generating multiplexer control signals to control the shifting of the serial test patterns into the associated scan chains.

8. The method of claim 7, wherein the step of offsetting triggering edges comprises the step of offsetting shift pulses of the multiplexer control signals associated with a particular one of the scan clusters from the shift pulses of the multiplexer control signals associated with other ones of the scan clusters.

9. The method of claim 1, wherein the step of generating test control signals comprises the step of generating release signals for each of the logic clusters, to control the release of serial test patterns into the system logic of each of the logic clusters.

10. The method of claim 9, further comprising the step of offsetting active triggering edges of each of the test control signals, wherein the release signals associated with a particular one of the logic clusters are offset from the release signals associated with other ones of the logic clusters.

11. The method of claim 10, wherein the step of controlling the release functions comprises the steps of:

(a) releasing the serial test patterns into the system logic of the particular one of the logic clusters when a corresponding one of the scan chains receive the release signals associated with the particular one of the logic clusters; and (b) releasing the serial test patterns into the system logic of the other ones of the logic clusters when their corresponding ones of the scan chains receive the release signals associated with the other ones of the logic clusters.

12. The method of claim 1, wherein the step of generating test control signals comprises the step of generating capture signals for each of the logic clusters, to control the storing of functional logic test results in the associated scan chains.

13. The method of claim 12, further comprising the step of offsetting active triggering edges of each of the test control signals, wherein the capture signals associated with a particular one of the logic clusters are offset from the capture signals associated with other ones of the logic clusters.

14. The method of claim 13, wherein the step of controlling the capture functions comprises the steps of:

(a) capturing the functional logic test results from the system logic of the particular one of the logic clusters when a corresponding one of the scan chains receive the capture signals associated with the particular one of the logic clusters; and (b) capturing the functional logic test results from the system logic of other ones of the logic clusters when their corresponding ones of the scan chains receive the capture signals associated with the other ones of the logic clusters.

15. A scan-based test system for use with a pattern generator capable of generating serial patterns of test bits for testing a system logic design, the scan-based test system comprising:

(a) a plurality of logic clusters each including a predetermined portion of the system design logic;

(b) clock signal generator means for concurrently generating a plurality of phase-shifted scan clock signals on a plurality of scan clock output terminals; and (c) a plurality of scan latch chains, each of the scan latch chains coupled to a different one of the scan clusters, wherein each of the plurality of scan latch chains comprises:

(i) scan data input means, coupled to the pattern generator for receiving one of the serial patterns of test bits; and (ii) scan clock input means, coupled to an exclusive one of the plurality of scan clock output terminals, for receiving a corresponding one of the phase-shifted scan clock signals, and for causing the serial pattern of test bits to step through the scan latch chain on each triggering edge of the corresponding phase-shifted scan clock signal.

16. The scan-based test system of claim 15, wherein the clock signal generator means further comprises means for generating a release signal on a release output terminal.

17. The scan-based test system of claim 16, wherein each of the plurality of scan latch chains further comprises:
  (a) scan data output means for releasing a corresponding one of the serial patterns of test bits to the predetermined portion of the system design logic of a corresponding one of the logic clusters; and
  (b) release input means, coupled to the release output terminal, for receiving the release signal and causing the scan data output means to release the corresponding one of the serial patterns of test bits in response thereto.

18. The scan-based test system of claim 17, wherein the clock signal generator means further comprises means for generating a capture signal on a capture output terminal.

19. The scan-based test system of claim 18, wherein each of the plurality of scan latch chains further comprises:
  (a) test result input means for receiving logic test result bits from the predetermined portion of the system design logic of the corresponding one of the logic clusters; and
  (b) capture input means, coupled to the capture output terminal, for receiving the capture signal and causing the test result input means to latch the corresponding logic test result bits in response thereto.

20. The scan-based test system of claim 15, wherein the clock signal generator means further comprises release signal generating means for generating a plurality of release signals on a plurality of release output terminals.

21. The scan-based test system of claim 20, wherein each of the plurality of scan latch chains further comprises:
  (a) data output means for releasing a corresponding one of the serial patterns of test bits to the predetermined portion of the system design logic of a corresponding one of the logic clusters; and
  (b) release input means, coupled to an exclusive one of the release output terminals, for receiving a corresponding one of the release signals and for causing the data output means to release the corresponding one of the serial patterns of test bits in response thereto.

22. The scan-based test system of claim 21, further comprising release sequencing means coupled to the release signal generating means, for alternately driving the plurality of release signals on the plurality of release output terminals.

23. The scan-based test system of claim 21, wherein the clock signal generator means further comprises means for generating a plurality of capture signals on a plurality of capture output terminals.

24. The scan-based test system of claim 23, wherein each of the plurality of scan latch chains further comprises:
  (a) test result input means for receiving logic test result bits from the predetermined portion of the system design logic of the corresponding one of the logic clusters; and
  (b) capture input means, coupled to an exclusive one of the capture output terminals, for receiving a corresponding one of the capture signals and causing the test result input means to latch the corresponding logic test result bits in response thereto.

25. The scan-based test system of claim 24, further comprising capture sequencing means coupled to the capture signal generating means, for alternately driving the plurality of capture signals on the plurality of capture output terminals.

26. The scan-based test system of claim 15, wherein the scan-based test system comprises the pattern generator.

27. The scan-based test system of claim 15, wherein the different ones of the logic clusters are coupled to more than one of the scan latch chains.

28. A method for reducing simultaneous switching during scan-based testing of system logic, the method comprising the steps of:
  (a) generating serial patterns of test bits;
  (b) dividing the system logic into a plurality of logic clusters and scan clusters, each scan cluster comprising at least one scan chain;
  (c) concurrently shifting a different one of the serial patterns of test bits into each scan chain of each scan cluster;
  (d) controlling test bit shifting to shift the test bits of each scan cluster at times offset from the times the test bits of other ones of the scan clusters are shifted;
  (e) alternately releasing the serial patterns of test bits from each of the scan chains into corresponding, predetermined ones of the logic clusters such that no two logic clusters release the serial patterns of test bits simultaneously; and
  (f) alternately capturing logic test results into each of the scan chains from the predetermined ones of the logic clusters such that no two logic clusters capture the logic test results simultaneously.

29. The method of claim 28, wherein each of the scan clusters comprises a plurality of scan chains.

30. The method of claim 29, wherein the step of dividing the system logic into logic clusters comprises the step of overlapping the logic clusters such that each of the logic clusters has common logic with another one of the logic clusters.

31. The method of claim 30, wherein the step of concurrently shifting comprises the step of concurrently shifting a different one of the serial patterns of test bits into the scan chains and each of the scan chains of each corresponding scan cluster.

32. The method of claim 31, wherein the step of controlling test bit shifting comprises the step of shifting the test bits in the scan chains corresponding to one of the scan clusters at times offset from the times the scan chains corresponding to other ones of the scan clusters are being shifted.

33. The method of claim 29, wherein the step of concurrently shifting comprises the step of concurrently shifting a different one of the serial patterns of test bits into each of the scan chains in the plurality of scan chains of each scan cluster.

34. The method of claim 28, further comprising the step of comparing the logic test results from each of the scan chains with corresponding expected test results.

35. The method of claim 34, wherein the step of comparing comprises the step of compressing a plurality of the logic test results into a combined logic test result, and comparing the combined logic test result with an expected combined test result.

36. The method of claim 28, wherein the step of alternately releasing the serial patterns of test bits comprises the step of sequentially enabling each of the logic clusters to release their corresponding one of the serial patterns of test bits.

37. The method of claim 28, wherein the step of alternately capturing the logic test results comprises the step of sequentially enabling each of the logic clusters to capture their corresponding ones of the logic test results.

38. The method of claim 28, further comprising the step of alternately allowing the release of the serial patterns of test bits and the capture of the logic test results such that the release and the capture in any of the logic clusters are not simultaneously performed.

39. The method of claim 28, wherein the step of alternately releasing serial patterns of test bits further comprises the step of allowing a predetermined number of the logic clusters to simultaneously release their corresponding serial patterns of test bits.

40. The method of claim 28, wherein the step of alternately capturing logic test results further comprises the step of allowing a predetermined number of the logic clusters to simultaneously capture their corresponding logic test results.

41. The method of claim 28, further comprising the step of allowing a first predetermined number of the logic clusters to release their corresponding serial patterns of test bits simultaneously with a second predetermined number of the logic clusters which are capturing their corresponding logic test results.

* * * * *